United States Patent [19]

Nishi et al.

[11] Patent Number: 5,559,582

[45] Date of Patent: Sep. 24, 1996

[54] EXPOSURE APPARATUS

[75] Inventors: Kenji Nishi, Yokohama; Masaaki Aoyama, Chigasaki, both of Japan

[73] Assignee: Nikon Corporation, Tokyo, Japan

[21] Appl. No.: 283,829

[22] Filed: Aug. 1, 1994

Related U.S. Application Data

[63] Continuation-in-part of Ser. No. 103,141, Aug. 9, 1993, abandoned.

[30]   Foreign Application Priority Data

Aug. 28, 1992  [JP]  Japan ................................... 4-230069
Aug. 31, 1993  [JP]  Japan ................................... 5-216570

[51] Int. Cl.⁶ .................................................. G03B 27/52
[52] U.S. Cl. ................................................ 355/30; 355/53
[58] Field of Search ........................................ 355/30, 53

[56]               References Cited

U.S. PATENT DOCUMENTS 4,141,180  2/1979  Gill, Jr. et al. ........................... 51/5 R
4,383,757  5/1983  Phillips ...................................... 355/53
4,558,949  12/1985 Uehara et al. ............................ 356/152
4,650,983  3/1987  Suwa ......................................... 250/204
4,849,901  7/1989  Shimizu .................................... 364/468

FOREIGN PATENT DOCUMENTS 56-42205  4/1981  Japan .
5-82411   4/1993  Japan .

Primary Examiner—Arthur T. Grimley
Assistant Examiner—David A. Lane
Attorney, Agent, or Firm—Shapiro and Shapiro

[57]                 ABSTRACT

An exposure apparatus includes a cleaning tool which is located at a position where it is brought into contact with the entire surface of a wafer holder when a wafer stage moves within a predetermined driving range, and a vertical driving shaft for biasing the cleaning tool against the wafer holder. While the cleaning tool is biased against the wafer holder, the wafer stage is moved within the predetermined driving range, thereby cleaning the wafer holder.

34 Claims, 12 Drawing Sheets

| FIG. 8A |
| FIG. 8B |
| FIG. 8C |

EXPOSURE APPARATUS

This is a continuation-in-part of application Ser. No. 08/103,141 filed Aug. 9, 1993 now abandoned.

BACKGROUND OF THE INVENTION

1. Field of the Invention

The present invention relates to an exposure apparatus for holding, e.g., a wafer as a photosensitive substrate on a wafer stage through a wafer holder and exposing a reticle pattern onto the wafer and, more particularly, to an exposure apparatus having a cleaning means for cleaning foreign substances on the wafer holder.

2. Related Background Art

When a semiconductor element, a liquid crystal display element, or the like is to be manufactured by a photolithographic process, a projection exposure apparatus is used, which is designed to expose a pattern of a photomask or reticle (to be referred to as a reticle hereinafter) onto a wafer on a wafer stage through a projection optical system. In such a conventional projection exposure apparatus, a wafer is chucked and held by a wafer holder mounted on a wafer stage so as to firmly hold the wafer in a horizontal state.

If, however, the wafer is chucked while foreign substances such as dust are present between the wafer holder for holding the wafer and the wafer, the horizontal state of the exposure surface of the wafer is degraded by the foreign substances. The degradation in the horizontal state of the exposure surface causes a positional error and a focus error in each shot area of the wafer and hence is a major factor that decreases the yield in the manufacture of LSIs and the like. For this reason, in general, an exposure process is stopped every predetermined interval, and the wafer holder is moved to a position where the operator can reach the holder so as to allow the operator to wipe the overall wafer holder with his/her hand by using a whetstone or a dust-free cloth.

FIG. 5 shows the manner of a conventional wafer holder cleaning operation. Referring to FIG. 5, a stationary mirror 2X is fixed to a side surface of a projection optical system 1 in one direction (X direction), and a stationary mirror 2Y is fixed to a side surface of the projection optical system 1 in the Y direction perpendicular to the X direction. A wafer holder 3 is disposed below the projection optical system 1, and the wafer holder 3 is fixed on a wafer stage 5. The wafer holder 3 is a thin columnar member and having a plurality of concentric grooves 4 formed in its surface. A wafer is placed on the wafer holder 3, and a negative pressure is applied to the wafer by a vacuum pump through a large number of suction holes (not shown). As a result, the wafer is chucked and held by the wafer holder 3.

The wafer stage 5 is constituted by an XY stage, a Z stage, and the like. The XY stage can position a wafer at an arbitrary position within the movable range of the XY stage on a plane (XY plane) perpendicular to the optical axis of the projection optical system 1. The Z stage serves to position the wafer in the optical axis of the projection optical system 1. In order to perform positioning within the XY plane, an X-axis movable mirror 6X and a Y-axis movable mirror 6Y are fixed on the wafer stage 5. A laser beam LB1 is radiated from an X-axis laser interferometer (not shown) onto the stationary mirror 2X of the projection optical system 1, and a laser beam is also radiated parallel to the laser beam LB1 onto the movable mirror 6X. The X-axis laser interferometer always monitors the coordinates of the wafer stage 5 in the X direction with reference to the projection optical system 1.

Similarly, a laser beam LB3 is radiated from a Y-axis laser interferometer (not shown) onto the stationary mirror 2Y of the projection optical system 1, and a laser beam is also radiated parallel to the laser beam LB3 onto the movable mirror 6Y. The Y-axis laser interferometer always monitors the coordinates of the wafer stage 5 in the Y direction with reference to the projection optical system 1.

When the wafer holder 3 is to be cleaned, an end portion of the wafer stage 5 is moved to a position below the projection optical system 1, and the wafer stage 5 is fixed while the wafer is kept removed from the wafer holder, as shown in FIG. 5. A cleaning tool 7 constituted by a whetstone or a dust-free cloth is placed on the wafer holder 3. The operator then moves the cleaning tool 7 on the entire surface of the wafer holder 3, as indicated by a locus 9, while the cleaning tool 7 is biased against the wafer holder 3 with a constant pressure by using a hand 8, thereby removing foreign substances on the wafer holder 3.

If, however, the wafer holder 3 is manually cleaned by the operator as in the prior art, it takes about 30 minutes to one hour to wipe the entire surface of the wafer holder 3, thus shortening the actual exposure time. As a result, the throughput is decreased. If the wafer holder 3 is cleaned once or so per day in order to prolong the exposure time, the possibility that exposure will be performed with respect to a wafer while foreign substances are chucked on the wafer holder 3 is increased, resulting in a reduction in the yield of semiconductor elements and the like.

In addition, if a cleaning operation is manually performed by the operator, the surface of the wafer holder 3 may be partly left unwiped, and new foreign substances from the operator may adhere to the wafer holder 3.

In order to solve these disadvantages, for example, Japanese Laid-Open Patent Application No. 5-82411 proposes a technique of automatically cleaning the wafer holder using a cleaning member. Additionally, to determine the presence/absence of foreign substances such as dust, U.S. Pat. No. 4,849,901 proposes a method in which the previous focus position in a shot area is compared with the current focus position in the shot area by a focus check mechanism for detecting the focus position of a wafer, thereby determining the presence/absence of foreign substances. However, in the conventional method of determining the presence/absence of foreign substances, exposure is performed to an intermediate shot area, and an alarm is generated at a shot position where foreign substances are confirmed to be present. For this reason, if foreign substances are present, the cleaning process must be repeated. Therefore, even if the cleaning operation is automatically performed in the cleaning process, the throughput of the entire exposure process cannot be improved although the yield of finished products can be increased.

SUMMARY OF THE INVENTION

The present invention has been made in consideration of the above situation, and has as its object to provide an exposure apparatus which can automatically clean a holding member such as a wafer holder at a high speed.

According to the present invention, for example, as shown in FIG. 1, an exposure apparatus including a stage (5) which has a holding member (3) having a chucking member, holds a photosensitive substrate through the holding member (3), and moves within a predetermined driving range on a two-dimensional plane, and an illumination optical system (10, 13, 14) for focusing exposure light and illuminating a mask (15) with the exposure light, the exposure apparatus being adapted to expose a pattern of the mask (15) onto the photosensitive substrate chucked by said holding member (3), comprises a holding member cleaning member (26) located at a position where it is brought into contact with the entire surface of the holding member (3) when the stage (5) moves within the predetermined driving range, and a biasing means (23, 24) for biasing the cleaning member (26) against the holding member (3), wherein the stage (5) is moved within the predetermined driving range to clean the holding member (3) while the cleaning member (26) is biased against the holding member (3).

In this case, for example, as shown in FIGS. 4A and 4B, the cleaning member is constituted by an abrasive whetstone (31) capable of scraping foreign substances off and a non-abrasive dust-free cloth (33) capable of wiping foreign substances off.

According to the present invention having such an arrangement, the cleaning member (26) for cleaning the holding member (3) is located at a position where it can be brought into contact with the entire surface of the holding member (3), and is biased and brought into contact with the surface of the holding member (3) with a constant pressure (e.g., the weight of the cleaning member). The stage (5) is then moved at a high speed in this state to cause the cleaning member (26) to clean the entire surface of the holding member (3), thereby automatically cleaning the holding member (3) at a high speed. Since no operator directly operates the apparatus, no foreign substances from the operator adhere to the holding member (3).

For example, as shown in FIGS. 4A and 4B, if the abrasive whetstone (31) capable of scraping foreign substances off and the non-abrasive dust-free cloth capable of wiping foreign substances off are alternately brought into contact with the holding member (3) by using a switching means (28, 29), the holding member (3) can be more effectively cleaned.

In addition, if the cleaning operation is to be automatically performed, the cleaning time can be shortened. However, the removed foreign substances can fall from the cleaning member and stick to the wafer holder again. Furthermore, when the wafer is removed (unloaded) from the wafer holder, dust accumulated in the groove portions of the wafer holder is scattered to stick to the upper portion of the wafer holder again. This dust cannot be prevented from sticking to the wafer. To avoid these disadvantages, a method can be considered in which the cleaning member is retreated from the upper portion of the wafer holder toward the side surface immediately after the cleaning of the wafer holder is finished. In this case, however, a retreat time is needed to disadvantageously prolong the cleaning time.

The present invention has been made in consideration of the above situations, and has as its object to provide a cleaning apparatus, arranged in an exposure apparatus for exposing a pattern of a reticle onto a wafer, for cleaning a wafer holder for holding the wafer, in which a cleaning operation is efficiently performed, thereby improving the throughput of the exposure process. It is another object of the present invention to more properly clean the wafer holder in such a cleaning apparatus.

In order to achieve the above objects, according to the present invention, there is provided a cleaning apparatus for an exposure apparatus, arranged in an exposure apparatus having an illumination optical system for illuminating a mask on which a transfer pattern is formed, a substrate holding member for sucking and holding a photosensitive substrate to which the pattern of the mask is transferred, and a substrate stage for moving the substrate to a predetermined exposure area on a two-dimensional plane parallel to the substrate through the substrate holding member, for cleaning the substrate holding member, comprising surface state measuring means for measuring a three-dimensional or Gradient state of the substrate holding member, operation control means for obtaining an area on a surface of the substrate holding member, which need to be cleaned, from a measurement result from the surface state measuring means, and cleaning means for cleaning an area on the surface of the substrate holding member, which is acknowledged to need to be cleaned.

DETAILED DESCRIPTION OF THE PREFERRED EMBODIMENTS

Figure 5:
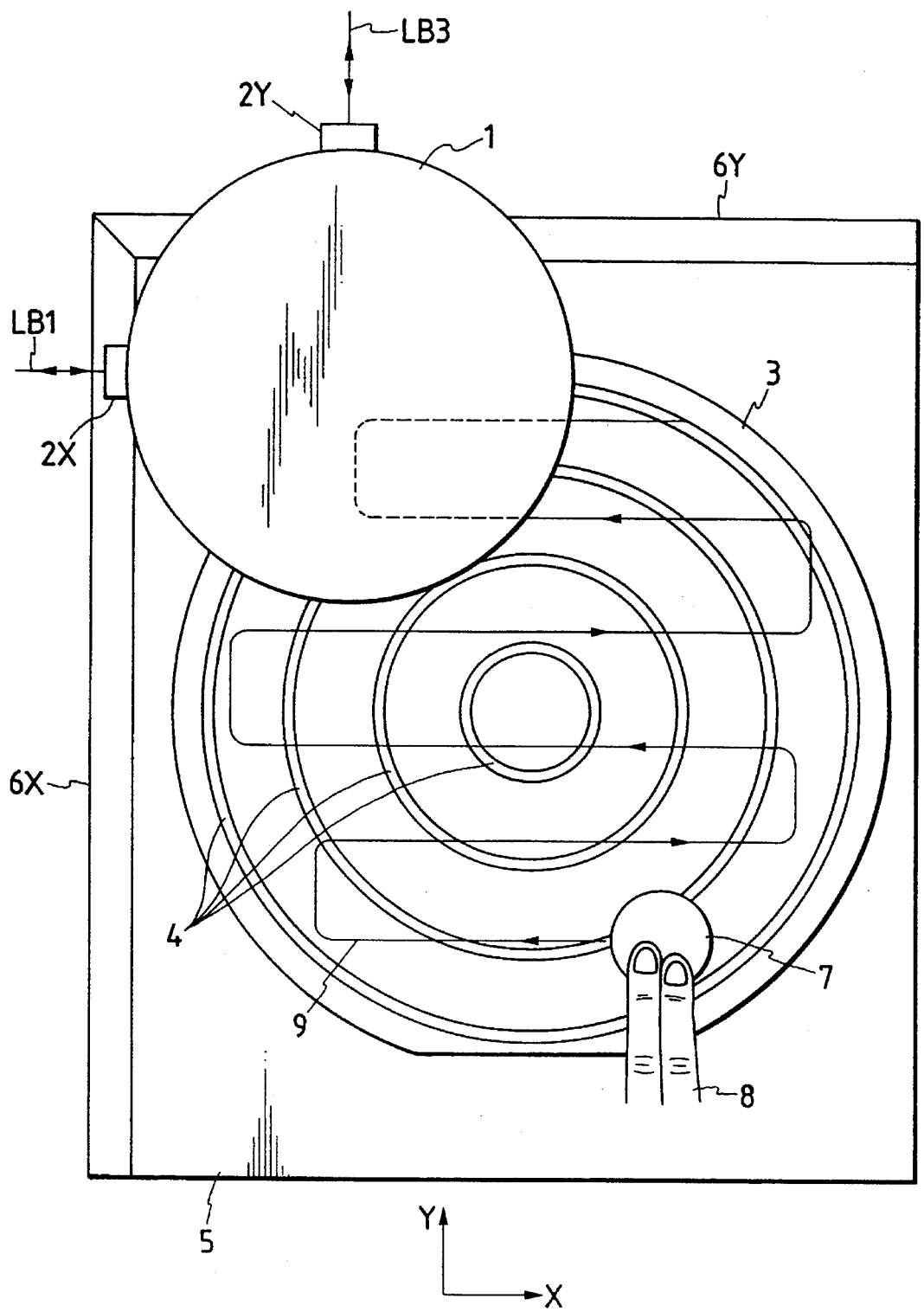
FIG. 5 is a plan view showing the main part of a projection exposure apparatus used to explain a conventional method of cleaning a wafer holder.

An exposure apparatus according to an embodiment of the present invention will be described below with reference to FIGS. 1 to 3. In this embodiment, the present invention is applied to a projection exposure apparatus designed to hold a wafer through a wafer holder. The same reference numerals in FIGS. 1 to 3 denote the same parts as in FIG. 5, and a detailed description thereof will be omitted.

Figure 1:
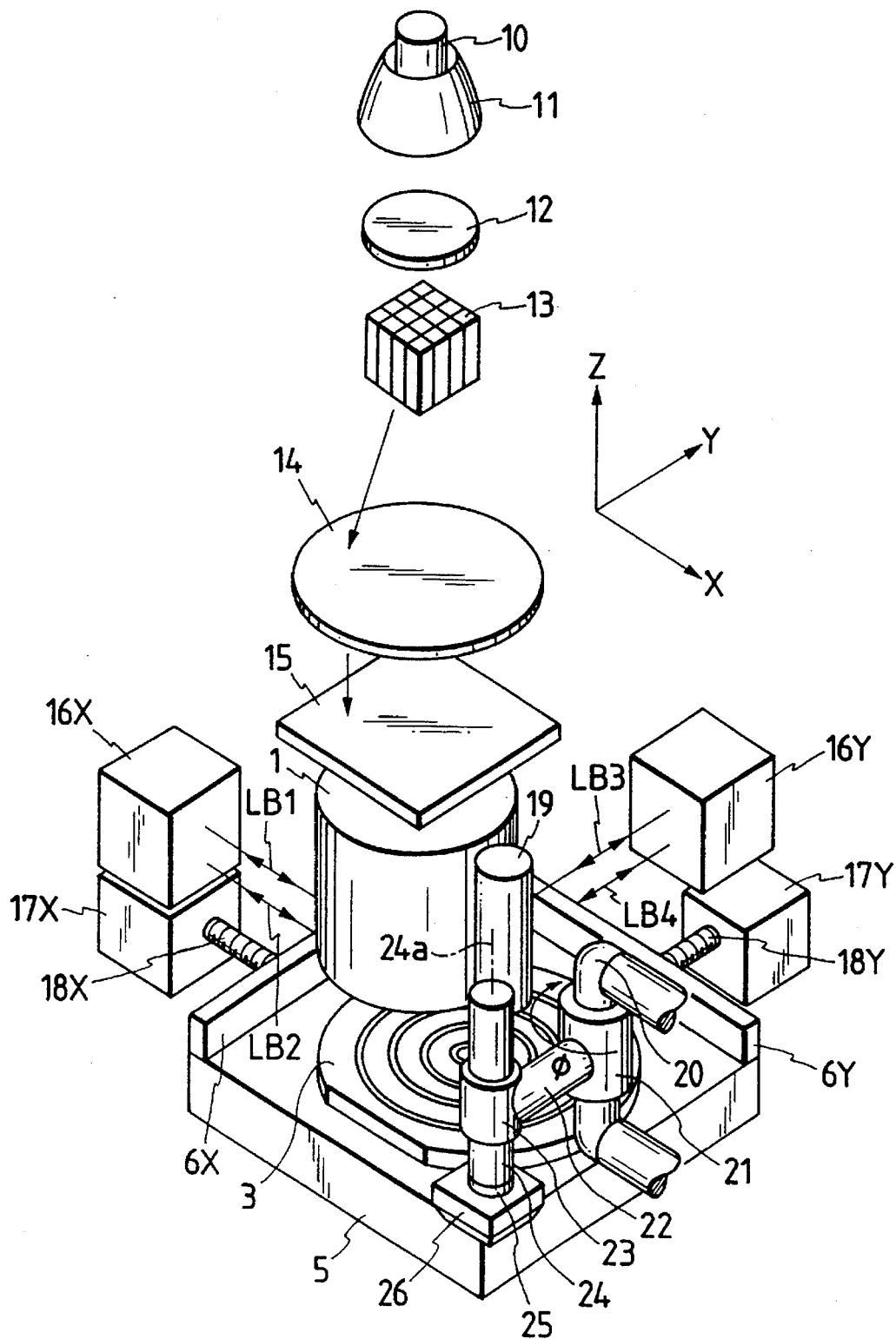
FIG. 1 is a partially cutaway perspective view of a projection exposure apparatus according to an embodiment of the present invention.

FIG. 1 shows a schematic arrangement of the projection exposure apparatus of this embodiment. Referring to FIG. 1, exposure light emitted from a light source 10 such as a mercury lamp is focused by an elliptic mirror 11 and is collimated into a substantially parallel beam by an input lens 12. The beam is then incident on a fly-eye lens 13. A large number of secondary sources are formed on the rear-side (reticle-side) focal plane of the fly-eye lens 13. Exposure light emerging from these secondary sources is focused by a condenser lens system 14 to be radiated on a reticle 15 with a uniform illuminance. Although not shown, the condenser lens system 14 has a variable field stop. With this variable field stop, an illumination field on the reticle 15 can be arbitrarily set.

A projection optical system 1 and a wafer stage 5 are arranged below the reticle 15 in the order named, and a wafer holder 3 is fixed on the wafer stage 5. In an exposure operation, a wafer is chucked and held on the wafer holder 3, and a pattern of the reticle 15 is projected/exposed on each shot area on the wafer through the projection optical system 1 by using exposure light.

Two laser beams LB1 and LB2 from an X-axis laser interferometer 16X are respectively reflected by a stationary mirror 2X (see FIG. 3) of the projection optical system 1 and a movable mirror 6X on the wafer stage 5. Two laser beams LB3 and LB4 from a Y-axis laser interferometer 16Y are respectively reflected by a stationary mirror 2Y (see FIG. 3) of the projection optical system 1 and a movable mirror 6Y on the wafer stage 5. With this operation, the X- and Y-coordinates of the wafer stage 5 are measured by the laser interferometers 16X and 16Y. The X-axis driving unit 17X drives the wafer stage 5 in the X direction through a driving shaft 18X, and the Y-axis driving unit 17Y drives the wafer stage 5 in the Y direction through a driving shaft 18Y, thereby setting the relative coordinates (X,Y) of the wafer stage 5 with respect to the projection optical system 1 to be arbitrary coordinates.

In this embodiment, an off-axis alignment microscope 19 is arranged near a side surface of the projection optical system 1. The coordinates of an alignment mark on the wafer are detected by the alignment microscope 19 to perform alignment of the wafer. A rotating shaft 20 fixed to be spaced apart from the projection optical system 1 has a driving unit (not shown). A cylindrical rotating/driving portion 21 is fitted on the rotating shaft 20. A cylindrical vertical driving portion 23 is connected to the rotating/driving portion 21 through an arm 22. A vertical driving shaft 24 is fitted in the vertical driving portion 23. A cleaning tool 26 constituted by an abrasive whetstone for scraping foreign substances off, non-abrasive durst-free cloth for wiping foreign substances off, or the like is mounted on the lower end of the vertical driving shaft 24 through a connecting portion 25. The rotating shaft 20 is parallel to the optical axis of the projection optical system 1, and the arm 22 is rotated about the rotating shaft 20 in a φ direction by the rotating/driving portion 21. That is, the arm 22 is moved to a cleaning position P1 when cleaning is to be performed, and to a cleaning stop position P2 when cleaning is not be performed. A center 24a of the vertical driving shaft 24 is parallel to the optical axis of the projection optical system 1, and the cleaning tool 26 is moved to the direction of the center 24a by the vertical driving portion 23.

An operation of cleaning the wafer holder 3 in the first embodiment will be described below with reference to the flow chart shown in FIG. 2 and FIG. 3. FIG. 3 is a plan view showing the wafer holder 3, when viewed from the projection optical system 1 side.

Figure 2:
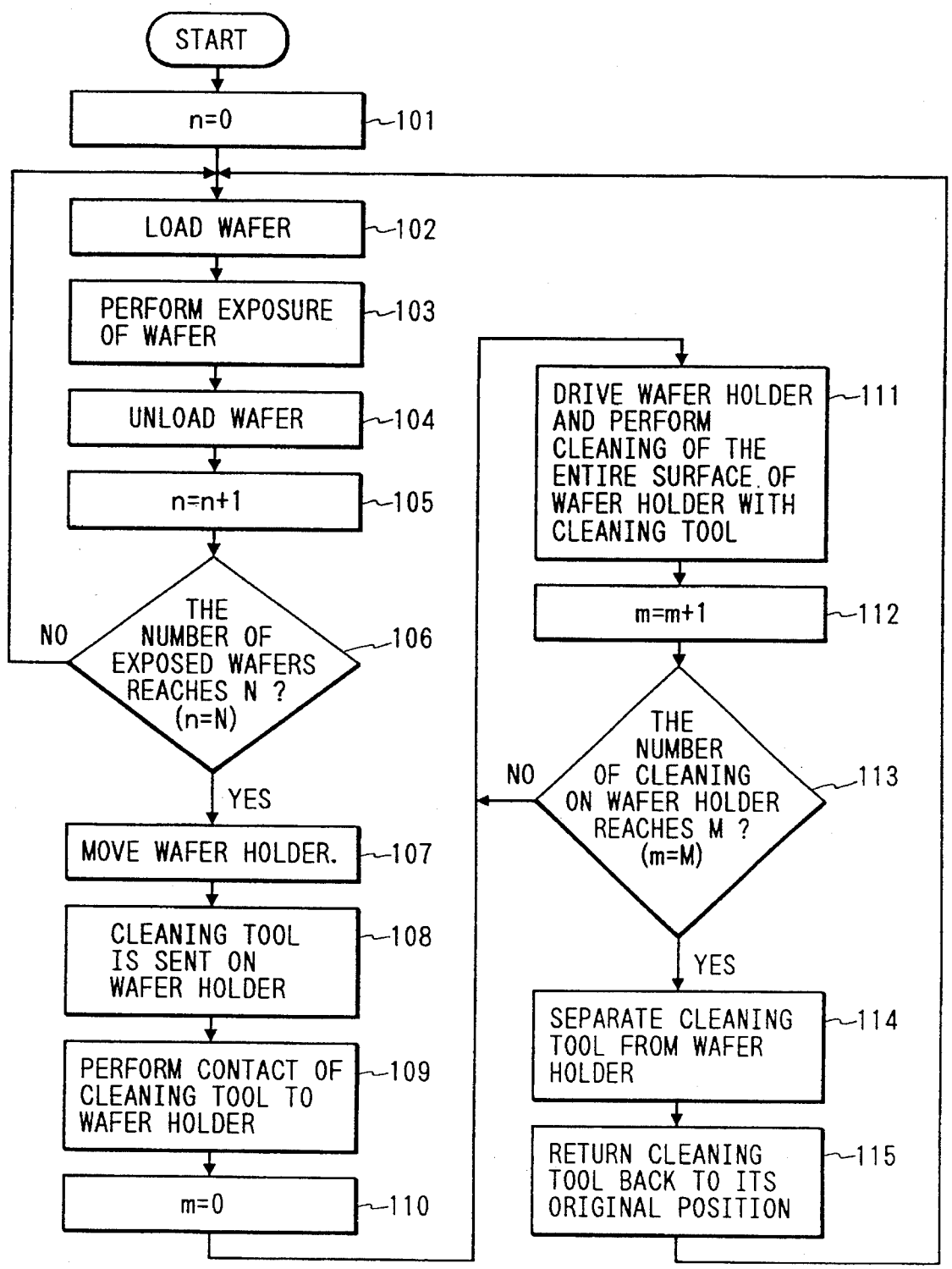
FIG. 2 is a flow chart showing an exposure operation and a cleaning operation for a wafer holder in the embodiment.
Figure 3:
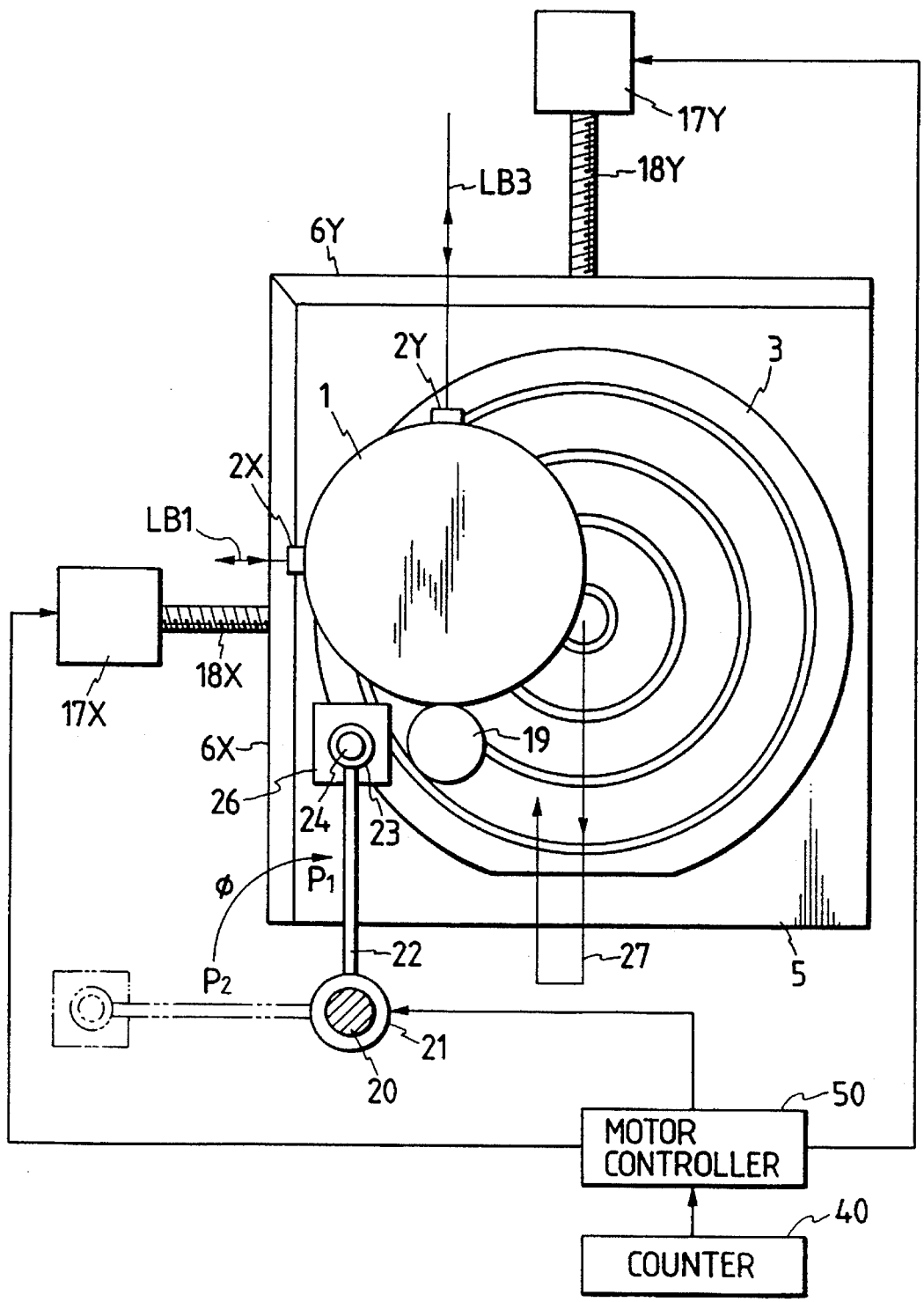
FIG. 3 is a plan view showing the main part of the wafer holder 3, when viewed from the projection optical system 1 side.

First, in step 101 in FIG. 2, the value of a variable n is initialized to 0. In step 102, a wafer to be exposed is chucked and held on the wafer holder 3. In step 103, the wafer is exposed. In step 104, the wafer is removed (unloaded) from the wafer holder 3. In step 105, 1 is added to the value of the variable n. This operation is a count operation performed by a counting means to count the number of exposed wafers.

In step 106, it is checked whether the number of exposed wafers has reached a predetermined number N, i.e., the variable n has reached the number N. If NO in step 106, the flow returns to step 102 to expose the next wafer. If it is determined in step 106 that N wafers are completely exposed, the flow advances to step 107 to drive the wafer stage 5 in accordance with a signal from a motor controller 50 so as to move the wafer holder 3 to a cleaning start position and stop the wafer stage 5, as shown in FIG. 3. In step 108, the arm 22 is rotated in the φ direction by the rotating/driving portion 21, and the vertical driving shaft 24 having the cleaning tool 26 mounted thereon is conveyed and fixed to the cleaning position P1 near the alignment microscope 19.

In general, the alignment microscope 19 is disposed at a position where the entire surface of a wafer on the wafer holder 3 can be observed. Therefore, by setting the cleaning position P1 near the alignment microscope 19, the cleaning tool 26 can reliably scan the entire surface of the wafer holder 3. In step 109, the vertical driving shaft 24 is lowered toward the wafer stage 5, and the cleaning tool 26 is brought into contact with the wafer holder 3 with a predetermined pressure.

In step 110, the value of a variable m is initialized to 0. In step 111, the wafer stage 5 is driven to start uniform movement of the wafer holder 3, mounted on the wafer stage 5, along a route 27 indicated by arrows. With this operation, the cleaning tool 26 comes into slidable contact with the surface of the wafer holder 3 to clean the wafer holder 3. After the cleaning tool 26 scans the entire surface of the wafer holder 3, 1 is added to the value of the variable m in step 112. In step 113, it is checked whether the entire surface of the wafer holder 3 is cleaned M times, i.e., the value of the variable m has reached the value M.

If NO in step 113, the flow returns to step 111 to cause the cleaning tool 26 to clean the entire surface of the wafer holder 3 again. When the surface of the wafer holder 3 is to be repeatedly cleaned, the cleaning tool 26 is scanned along the immediately preceding scanning route in the opposite direction, thus shortening the cleaning time. When the M cleaning operations are completed, the flow advances from step 113 to step 114 to move the vertical driving portion 23 upward, separating the cleaning tool 26 from the wafer holder 3. Subsequently, in step 115, the arm 22 is rotated in a direction opposite to the φ direction by the rotating/driving portion 21 so as to move the cleaning tool 26 to the cleaning pause position P2 where the cleaning tool 26 does not interfere with a wafer sending operation, an exposure operation, and the like. The flow then advances to step 102 to perform exposure with respect to a wafer to be exposed.

Figure 4:
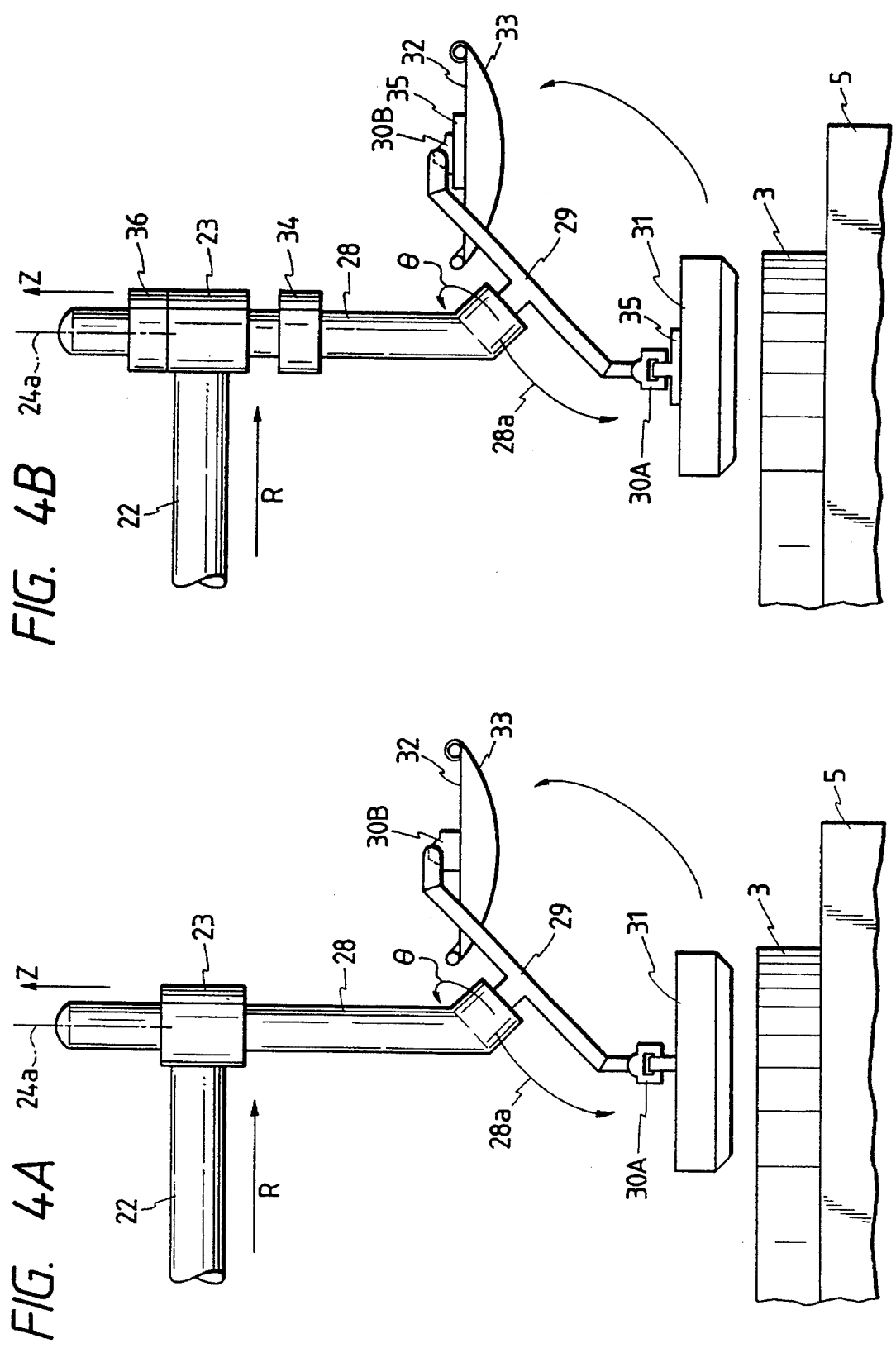
FIG. 4A is a view showing the main part of the second embodiment of a cleaning tool.
FIG. 4B is a view of a cleaning tool to which a biasing force sensor member, a biasing force adjusting member, and a vibrating member are added.

The second embodiment of the cleaning tool will be described next with reference to FIG. 4A. FIG. 4A shows a state of a wafer holder 3 in a cleaning operation. Referring to FIG. 4A, in which the same reference numerals denote the same parts as in FIG. 1, a vertical driving shaft 28 is fitted in a vertical driving portion 23 connected to the other end of an arm 22. A lower end portion 28a of the vertical driving shaft 28 is bent into an L shape. A rotating arm 29 is mounted on the distal end of the lower end portion 28a. The rotating arm 29 can be rotated about the axis of the lower end portion 28a in the 8 direction by a driving unit in the lower end portion 28a. A thin rectangular parallelepiped whetstone 31 is attached to one end of the rotating arm 29 through a connecting portion 30A. A take-up portion 32 is attached to the other end of the rotating arm 29 through a connecting portion 30B. A dust-free cloth 33 is wound around the take-up portion 32.

When the wafer holder 3 is to be cleaned, the arm 22 is moved or rotated in an R direction parallel to the surface of the wafer holder 3, and the rotating arm 29 is rotated in a θ direction to move the whetstone 31 or the dust-free cloth 33 onto the wafer holder 3. Thereafter, the vertical driving shaft 28 is lowered toward the wafer holder 3 along an axis 24a parallel to a Z axis, thereby bringing the whetstone 31 or the dust-free cloth 33 into contact with the wafer holder 3. In this case, since the whetstone 31 and the dust-free cloth 33 respectively having predetermined weights are attached to the rotating arm 29 to be freely movable, the whetstone 31 and the dust-free cloth 33 are biased against the surface of the wafer holder 3 at predetermined pressures corresponding to their weights. By moving the wafer holder 3 in this state, the wafer holder 3 is cleaned.

The whetstone 31 is generally effective with respect to foreign substances such as dust sticking to the wafer holder 3. The whetstone 31 is used once for several cleaning operations. In contrast to this, the dust-free cloth 33 is used to wipe dust and the like off from the wafer holder 3, as needed. By using the whetstone 31 and the dust-free cloth 33 alternately in this manner, the wafer holder 3 can be properly cleaned.

Foreign substances sticking to the whetstone 31 and the dust-free cloth 33 can be removed by applying vibration to the vertical driving shaft 28 through a vibration member 34 as shown in FIG. 4B, at the cleaning stop position $P_2$, so that there is no need for performing long-term maintenance of cleaning mechanism.

A contact position of the wafer holder 3 in contact with the dust-free cloth 33 is automatically changed by using a structure that the dust-free cloth 33 is wound on to the take-up portion 32 in a rolled fashion, so that no performing of long-term maintenance of cleaning mechanism can be required, either.

And the above-mentioned embodiment uses a structure that the whetstone 31 and the dust-free cloth 33 are separately in contact with the surface of the wafer holder 3. However, if the whetstone 31 and the dust-free cloth 33 are concurrently in contact with the surface of the wafer holder 3 to clean the surface of the wafer holder 3 by both the whetstone and the dust-free cloth at the same time, the wafer holder 3 can be quickly cleaned with the simple arrangement.

In the embodiment shown in FIG. 4A, a biasing force acting on the wafer holder 3 is set by the weight of the whetstone 31 or the dust-free cloth 33 as a cleaning tool. As shown in FIG. 4B, however, an actual biasing force acting on the wafer holder 3 may be monitored by a biasing force sensor 35, and the wafer holder 3 may be cleaned while a predetermined pressure is applied by a pressure adjusting member 36. In addition, if the contact area of the cleaning member is set to be a value allowing the cleaning member to come into contact with two different portions of the convex portion of the convex and concave portions of the wafer holder 3, the cleaning member is not caught by an edge portion of the wafer holder 3 during a cleaning operation.

The present invention is not limited to the above-described embodiments, and various changes and modification can be made within the spirit and scope of the invention.

The third embodiment of the present invention will be described below. The same reference numerals and symbols as in the first embodiment denote the same parts in the third embodiment, and a detailed description thereof will be omitted.

Figure 6:
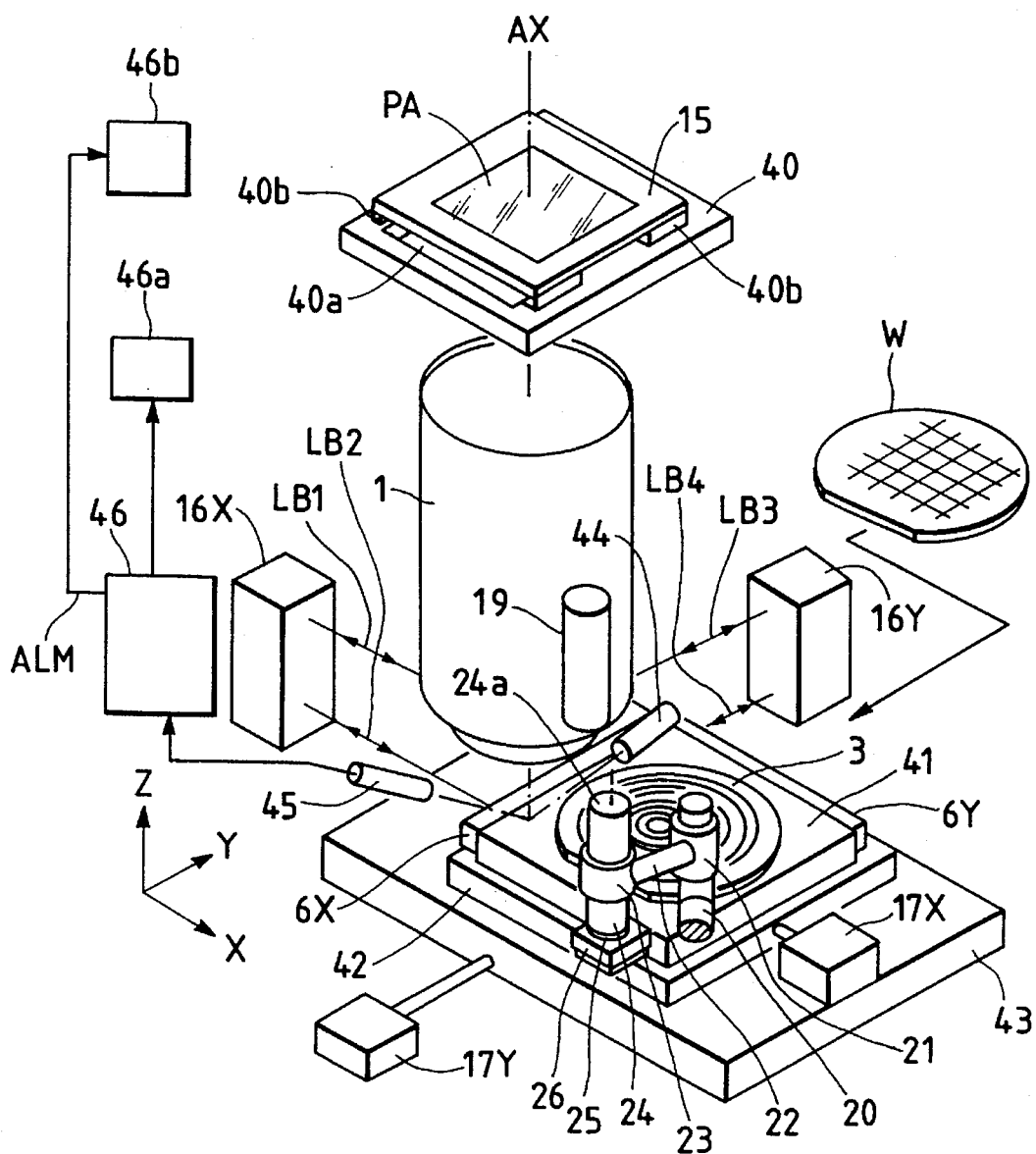
FIG. 6 is a perspective view showing the main part of a projection exposure apparatus according to the third embodiment of the present invention.

FIG. 6 shows the schematic arrangement of a projection exposure apparatus of this embodiment. Referring to FIG. 6, exposure light emitted from an illumination optical system (not shown) illuminates a reticle 15 having a pattern area PA in which a circuit pattern or the like is formed with almost a uniform illuminance. The reticle 15 is held on a reticle holder 40 having vacuum sucking portions 40b at its four corners. The reticle holder 40 has an opening 40a corresponding to the pattern area PA. The reticle 15 is positioned such that the center (reticle center) of the pattern area PA is aligned on an optical axis AX of a projection optical system 1.

The reduced image of the pattern of the reticle 15 is focused and projected, through the projection optical system 1, on a wafer W on which a photoresist is coated. The wafer W is vacuum-sucked on a wafer holder (chuck) 3 having a surface set in parallel to the focusing plane of the projection optical system 1. The wafer holder 3 is mounted on a Z stage 41 which is vertically movable along the direction of the optical axis AX. The Z stage 41 is arranged on an X stage 42 which is linearly movable in the X direction. The X stage 42 is arranged on a Y stage 43 which linearly moves in the Y direction perpendicular to the X direction. The wafer W is two-dimensionally moved by the X and Y stages 42 and 43 on the X-Y plane and vertically moved by the Z stage 41 for focusing. The X stage 42 is moved by a driving portion 17X provided on the Y stage 43. The Y stage 43 is moved by a driving portion 17Y. In the apparatus shown in FIG. 1, the Z stage 41, the X stage 42, and the Y stage 43 are integrally shown as a wafer stage 5.

Movable mirrors 6X and 6Y are provided to the two sides of the Z stage 41, which are perpendicular to each other, respectively. Laser beams LB1 and LB2 parallelly emitted from a laser interferometer 16X in the X direction are vertically incident on the stationary mirror of the projection optical system 1 and the movable mirror 6X extending in the Y direction, respectively. Laser beams LB3 and LB4 parallelly emitted from a laser interferometer 16Y in the Y direction are vertically incident on the stationary mirror of the projection optical system 1 and the movable mirror 6Y extending in the X direction, respectively. The two-dimensional position (coordinates) of the wafer W is measured by the laser interferometers 16X and 16Y.

To detect the surface position of the wafer W in the Z direction (in the direction of the optical axis AX) when the wafer W is positioned in the exposure field of the projection optical system 1, an oblique incident focus detection system is provided. This focus detection system is constituted by an illumination optical system 44 for obliquely projecting a focusing light beam on the surface of the wafer W, and a condensing optical system 45 for receiving and photoelectrically detecting the reflected light of the light beam to output a focus signal in accordance with the height position (focus position) of the surface of the wafer W, or a deviation amount from the focusing plane of the projection optical system 1. The focus detection system is the same as that disclosed in, e.g., Japanese Laid-Open Patent Application No. 56-42205 or U.S. Pat. No. 4,650,983.

In this embodiment, a photoelectric focus detection system is used. However, a known so-called air micrometer focus detection system or the like, in which a gas is blown from a nozzle to the wafer W at a predetermined pressure, and the back pressure of the gas is detected, may also be used. As the focus detection system, a focus detection system as disclosed in U.S. Pat. No. 4,383,757 may also be used. In this focus detection system, light is radiated on a plurality of points on the wafer W, rather than one point on the wafer W, thereby parallelly detecting a plurality of focus positions on the wafer W. In place of the focus detection system, a leveling detection system for detecting the tilt angle of each shot area of the wafer W may also be used.

The focus signal from the condensing optical system 45 is supplied to a main control system 46. The main control system 46 obtains the distribution of the three-dimensional patterns of the surface of the wafer W from the supplied focus signal, thereby specifying a position where cleaning of the surface of the wafer holder 3 is needed from the distribution of the three-dimensional patterns. A keyboard (not shown) for externally controlling the state or sequence of the apparatus is provided. An operator sends necessary information to the main control system 46 through this keyboard. A display 46a such as a cathode-ray tube is used to display the state of the apparatus determined by the main control system 46. Information or alarm related to a parallelism (resolution failure) between the focusing plane of the projection optical system 1 and the surface of the wafer W is included in display data. An alarm unit 46b is also provided to independently display only an alarm related to the resolution failure. An alarm signal ALM from the main control system 46 is input to the alarm unit 46b. The alarm unit 46b changes the display state of sound, light, or the like in accordance with the content of the alarm signal ALM, thereby calling the operator's attention. The content of the alarm signal ALM is also included in the display data and also displayed on the display 46a.

Figure 7:
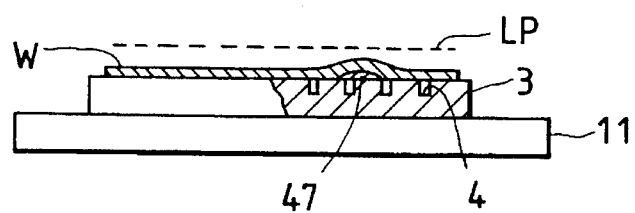
FIG. 7 is a partially cutaway front view showing a state wherein a wafer W is held on a wafer holder 3 in FIG. 6.
Figure 8:
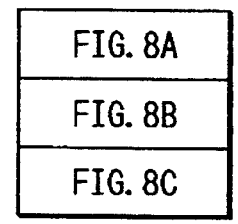
FIG. 8 is comprised of FIGS. 8A to 8C.
Figure 8A:
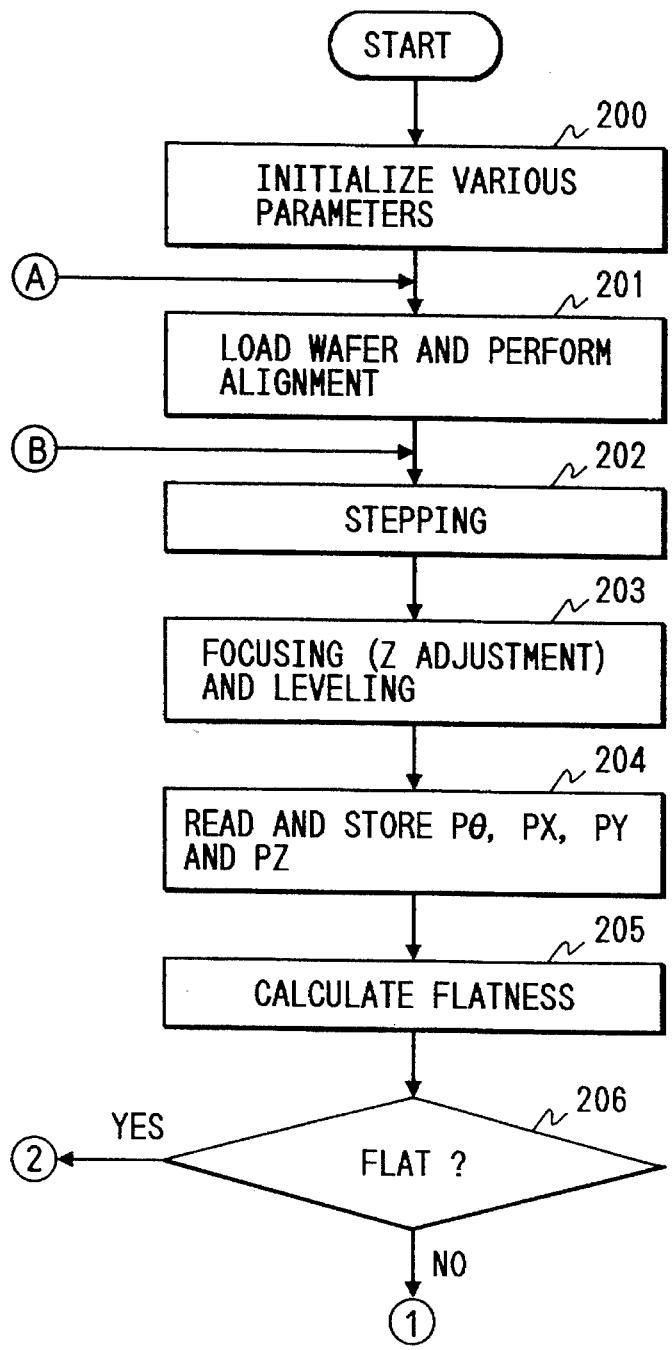
FIGS. 8A to 8C are flow charts showing an exposure operation and a cleaning operation for a wafer holder in the third embodiment.
Figure 8B:
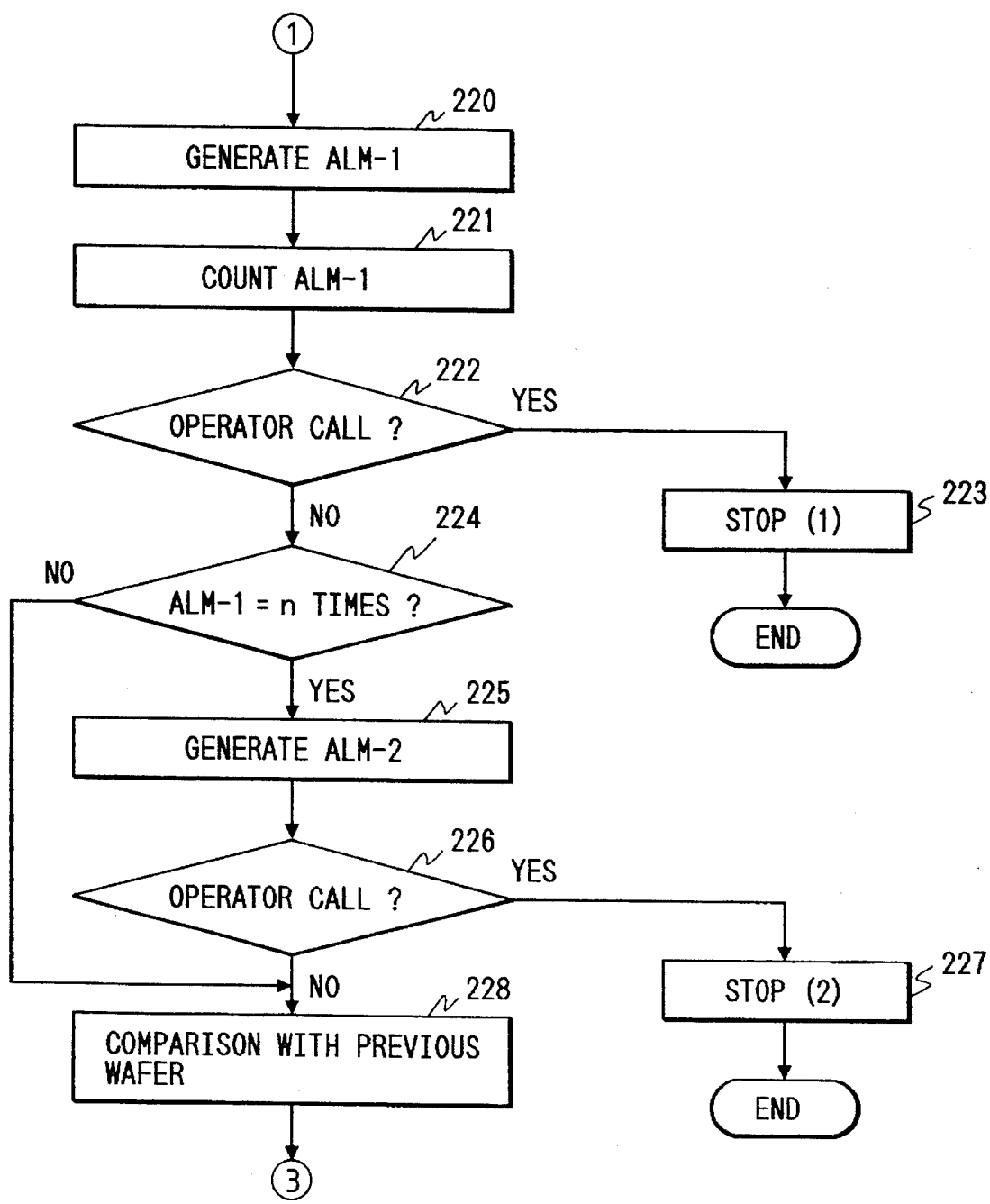
Figure 8C:
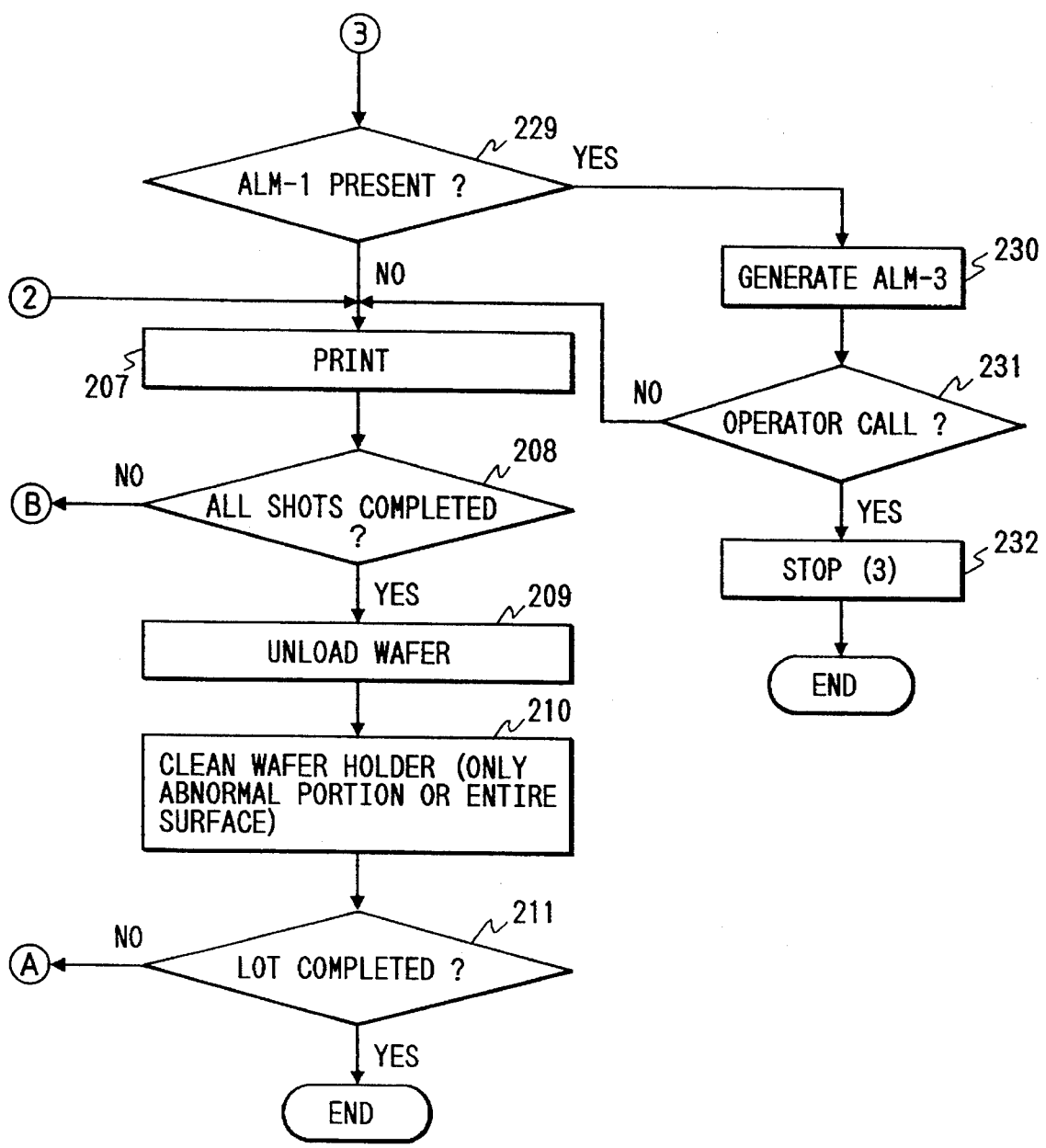

A cleaning operation for the wafer holder 3 in this embodiment will be described with reference to the flow charts in FIGS. 8A to 8C. As shown in FIG. 7, when dust 47 as foreign substances is present between the surface of the wafer holder 3 and the wafer W, the surface of the wafer W projects at a portion where the dust 47 is present. In this embodiment, using this phenomenon, the presence/absence and the position of the dust 47 are detected, and only the area where the dust 47 is present on the wafer holder 3 is exclusively cleaned. In addition, when grooves (concave portions) 4 are formed in the surface of the wafer holder 3, and the dust 47 is present in the grooves 4, various disadvantages (to be described later) occur. For this reason, the foreign substances in the grooves 4 are also removed, as needed.

An operation of this embodiment will be described below with reference to the flow charts in FIGS. 8A to 8C. These flow charts only schematically show the exposure operation of the apparatus. The actual exposure operation is constituted by a more complicated sequence. In this case, however, to simplify the description, operations except for the main operation of the present invention are simply described. This operation is performed when a plurality of wafers are continuously processed. Particularly, a case wherein wafers in a certain lot are continuously exposed is exemplified. The sequence of this operation will be described in accordance with steps in FIGS. 8A to 8C.
(Step 200)

When the exposure operation is started, the main control system 46 initializes various parameters necessary for the exposure operation. A typical parameter is the arrangement design value, i.e., the shot coordinate values of a chip on the wafer W. In the step and repeat method, positioning (stepping) of the two-dimensional movable stage is performed on the basis of the shot coordinate values. The main control system 46 also initializes parameters for setting an alarm generation mode.

These parameters (the functions thereof will be described later in detail) are used to set the types of alarms and the alarm generating method in advance in correspondence with a shot for causing a degradation in flatness of a to-be-exposed area of the wafer W, more specifically, a parallelism between the focusing plane of the projection optical system 1 and the surface of the exposure area (to be simply referred to as "flatness" hereinafter). In this embodiment, three types of alarms are generated. The first alarm is occasionally generated when the flatness is degraded at a shot position subjected to exposure. The second alarm is generated when the first alarm has been generated arbitrary $\underline{n}$ times or more during the exposure operation of one wafer. The third alarm is generated when the first alarm is generated at the same shot position on a different wafer. This parameter setting is performed to determine which mode of the alarm is selected, with which alarm the operation of the apparatus is stopped, and the like. These parameters are input from the keyboard in accordance with the request of the operator.
(Step 201)

The main control system 46 issues a command of wafer loading for extracting one wafer from a wafer cassette (not shown) and conveying it onto the wafer holder 3. At the same time, the main control system 46 issues a command for performing alignment (in this case, global alignment when the second layer et seq. are overexposed) of the wafer W on the wafer holder 3. With this alignment, the chip arrangement coordinate system on the wafer W is caused to uniquely correspond to the movement coordinate system of the stage.
(Step 202)

The main control system 46 outputs a drive signal to perform stepping of the stages 42 and 43 such that the designed shot coordinate values accord with position information PX and PY from the laser interferometers 16X and 16Y. Rectangular shot areas (chip patterns) are arranged in a matrix on the wafer W. The arrangement coordinates of each chip pattern accord with the movement coordinates of the stages, i.e., X- and Y-coordinates. In this embodiment, after exposure is performed for one array of chip patterns in the X direction, stepping is performed by only one row in the Y direction, and the next column of chip patterns is then subjected to exposure.
(Step 203)

The main control system 46 performs a focusing operation for a to-be-exposed shot area (chip pattern). The main control system 46 sets the driving unit (not shown) of the Z stage 41 in a servo control state on the basis of the focus signal from the condensing optical system 45, and outputs a drive signal appropriate to the servo control. With this operation, the position of the Z stage in the Z direction is adjusted such that the focusing plane of the projection optical system 1 accords with the surface of the to-be-exposed chip pattern. Assume that an oblique incident focus detection system disclosed in Japanese Laid-Open Patent Application No. 56-42205 or U.S. Pat. No. 4,650,983 is to be used. In this case, the height position of the surface of the chip pattern is detected almost at the center of the chip pattern. In other words, the height position is detected near the optical axis AX of the projection optical system 1. The focus signal becomes an analog signal corresponding to the deviation amount of surface of the chip pattern in the Z direction with respect to the focusing plane. When this deviation amount becomes zero by adjusting the Z stage 41, the analog value of the focus signal becomes a predetermined value (e.g., 0) representing focusing. The main control system 46 detects the predetermined value to end the focusing operation.
(Step 204)

The main control system 46 reads the pieces of position information PX and PY from the laser interferometers 16X and 16Y and position information PZ from the height detector (not shown) of the Z stage, and stores these values. The position information PZ corresponds to the position of the Z stage 41 in the Z direction when the surface of the to-be-exposed chip pattern accords with the focusing plane. The state at this time will be described with reference to FIG. 7. FIG. 7 exaggeratedly shows a case wherein the wafer W which is vacuum-sucked on the wafer holder 3 is not accurately fitted to the mount surface, and the flatness is degraded due to the presence of the dust 47. The Z position detector in the Z stage 41 is used to detect the change amount of the height position from a predetermined reference plane LP (plane parallel to the X-Y plane) of the Z stage 41. Assume that when intervals between the reference plane LP and the surfaces of the chip patterns on the wafer are measured without changing the height position of the Z stage 41, these intervals are represented by $Z_{15}, Z_{16}, \ldots, Z_{21}$, and $Z_{22}$, and an interval (predetermined value inherent to the apparatus) between the reference plane LP and the focusing plane of the projection optical system 1 is $Z_0$. In this case, when focusing is performed every time the chip pattern is exposed, the adjustment amount of the height position of the Z stage 41 for each chip pattern, i.e., pieces of position information $PZ_{15}, PZ_{16}, \ldots, PZ_{21}$, and $PZ_{22}$ are detected as $Z_0-Z_{15}, Z_0-Z_{16}, \ldots, Z_0-Z_{21}$, and $Z_0-Z_{22}$, respectively. The reference plane LP is an imaginary plane and may be matched with the focusing plane to set $Z_0=0$. In addition, even when a predetermined offset amount (to be described later in detail) is contained in each of the pieces of position information $PZ_{15}, PZ_{16}, \ldots, PZ_{21}$, and $PZ_{22}$, the offset amount is canceled when the flatness is calculated. For this reason, no problem is posed.

In this embodiment, the pieces of position information PX and PY are read from the laser interferometers 16X and 16Y. However, since the shot coordinate values of a to-be-exposed chip pattern are determined in advance, only the position information PZ may be actually read.
(Step 205)

Figure 9A:
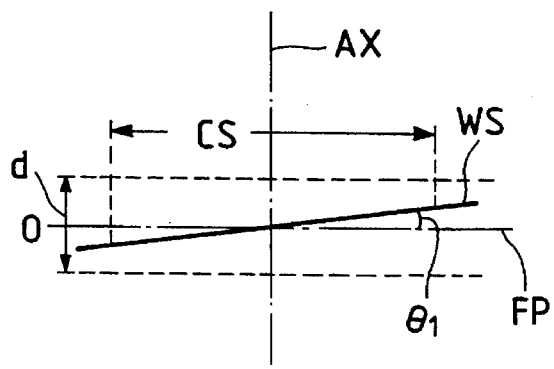
FIGS. 9A and 9B are views for explaining whether or not a resolution failure occurs.
Figure 9B:
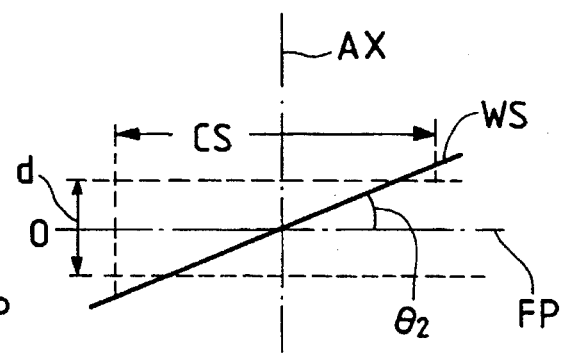

The main control system 46 calculates the flatness of a to-be-exposed chip pattern. The method of detecting the flatness will be described below with reference to FIGS. 9A, 9B, and 10. FIG. 9A is a view schematically showing a state wherein the flatness for one chip pattern is within an allowable range, and FIG. 9B is a view schematically showing a state wherein the flatness is out of the allowable range. Referring to FIGS. 9A and 9B, the optical axis AX of the projection optical system 1 is perpendicular to a focusing plane FP, and a focal depth d at which a desired resolution can be obtained is represented by a range in the direction of the optical axis AX. A size of a to-be-exposed chip pattern (or shot) is represented by CS, and a surface of the chip pattern is represented by WS. When focusing is performed, the chip center of the surface WS accords with the focusing plane FP. If the flatness of the surface WS is within the focal depth d throughout the size CS, as shown in FIG. 9A, exposure for the chip pattern does not cause a resolution failure.

However, as shown in FIG. 9B, when the surface WS is inclined to cause the periphery of the size CS to fall out of the range of the focal depth d, a resolution failure occurs at the periphery of the chip pattern. In such a small range of the size CS, even when the entire wafer is warped, the surface WS can be considered as almost a uniform plane. For this reason, the deviation amount of the end portion of the chip pattern (shot) from the focusing plane FP along the direction of the optical axis is about $(\frac{1}{2})CS.\sin\theta_1$ in FIG. 9A, or about $(\frac{1}{2})CS.\sin\theta_2$ in FIG. 9B, where $\theta$ represents the gradient of the surface WS with respect to the focusing plane FP. Therefore, when the deviation amount satisfies $|CS.\sin\theta|\leq d$, a desired resolution can be obtained throughout the chip pattern (shot). When the deviation amount satisfies $|CS.\sin\theta|>d$, a resolution failure occurs at the periphery of the chip pattern (shot). In this embodiment, a method in which the gradient $\theta$ is directly measured to detect the flatness by the above arithmetic operation, and a method in which the flatness is detected by a simple arithmetic operation from the correlation of the height positions of the Z stage 41 upon focusing between a to-be-exposed chip pattern (shot) on the wafer W and the adjacent chip patterns can be considered.

The former method will be described. In this method, the gradient $\theta$ of the surface WS with respect to the focusing plane FP is directly measured, thereby obtaining the flatness.

More specifically, a plurality of height positions which are not aligned on one line in a shot area of the wafer W are detected by the focus detection system 45 in FIG. 6 (measurement of Pθ). On the basis of a plurality of focus signals according to the height positions (or deviation amounts from the focusing plane of the projection optical system 1) of the surface of the wafer W (from a difference in magnitude between the plurality of focus signals), the main control system 46 calculates the gradient $\theta$ of the wafer surface WS with respect to the focusing plane FP (step 205).

The main control system 46 obtains the deviation amount $|CS.\sin\theta|$ of the chip pattern (shot) from the focusing plane FP along the direction of the optical axis using the shot size CS and the gradient $\theta$ and performs the comparison of $|CS.\sin\theta|\leq d$ (step 206). If it is determined that the surface WS is flat ($|CS.\sin\theta|\leq d$), the flow jumps to step 207.

Figure 10:
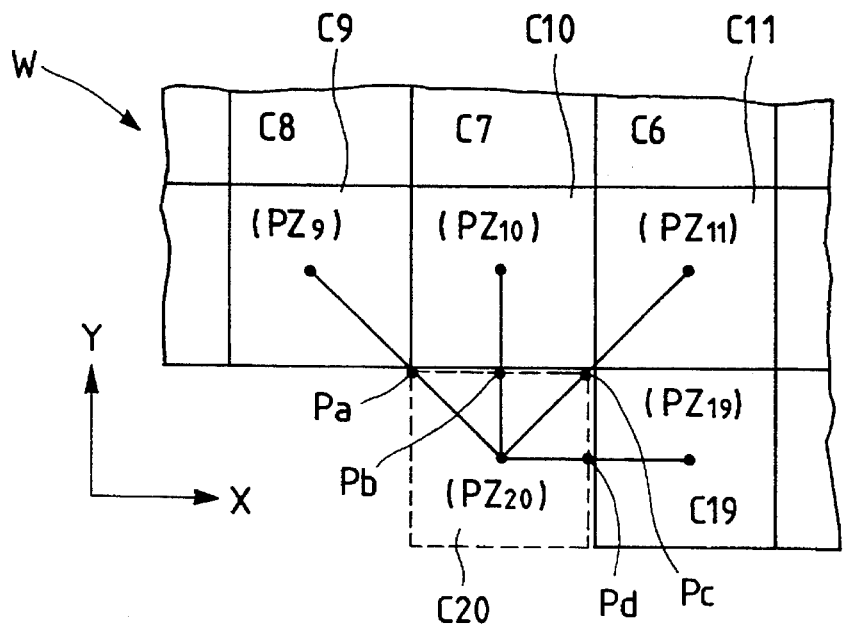
FIG. 10 is a plan view showing the arrangement of chip patterns for detecting the resolution failure.

The latter method will be described below. FIG. 10 is a view showing a chip arrangement when a chip pattern C20 is to be exposed after exposure for chip patterns C9 to C11, . . . has proceeded, and exposure for chip patterns C15 to C19 has been completed. FIG. 10 is an enlarged view of the chip patterns C9 to C11, C19, and C20. The chip patterns C9 to C11, and C19 are exposed chip patterns adjacent to the periphery of the to-be-exposed chip pattern C20. Pieces of position information $PZ_9$ to $PZ_{11}$, and $PZ_{19}$ related to the height positions of the centers of the chip patterns C9 to C11, and C19 are detected before each chip pattern is exposed, and stored in a memory connected to the main control system 46 in step 204. The main control system 46 calculates whether four points Pa, Pb, Pc, and Pd at the periphery of the chip pattern C20 are within a range of the focal depth $\underline{d}$ from position information $PZ_{20}$ related to the height position of the center of the to-be-exposed chip pattern C20 and the pieces of position information $PZ_9$ to $PZ_{11}$, and $PZ_{19}$.

Assume that the surfaces of the adjacent chip patterns can approximate to each other as linear displacement. In this case, displacement amounts $\Delta Z_a$, $\Delta Z_b$, $\Delta Z_c$, and $\Delta Z_d$ of the four points Pa, Pb, Pc, and Pd with respect to the chip centers along the direction of the optical axis are represented by the following equations.

$$\Delta Za=(\tfrac{1}{2})(|PZ_{20}-PZ_9|) \tag{1}$$

$$\Delta Zb=(\tfrac{1}{2})(|PZ_{20}-PZ_{10}|) \tag{2}$$

$$\Delta Zc=(\tfrac{1}{2})(|PZ_{20}-PZ_{11}|) \tag{3}$$

$$\Delta Zd = (½)(|PZ_{20} - PZ_{19}|) \quad (4)$$

As is apparent from these equations, deviations between the height position in the target exposure area (chip pattern C20) and the height positions in the peripheral exposure areas are detected. For this reason, even when a predetermined offset amount is contained in the detected height position, the offset amount is canceled. That is, the displacement amount according to the small local gradient on the wafer surface can always be accurately detected without any influence of the nonuniform thickness of the wafer W itself or the like.

The main control system 46 calculates the above equations (1), (2), (3), and (4), and stores the results in the memory. At this time, the main control system 46 must also perform a process for searching the already exposed chip patterns, i.e., chip patterns at the periphery of the chip pattern C20, whose position information PZ has already been detected, on the chip arrangement data.
(Step 206)

The main control system 46 determines whether the calculated displacement amounts $\Delta Za$, $\Delta Zb$, $\Delta Zc$, and $\Delta Zd$ are allowable values in relation to the focal depth d. Since the displacement amount $\Delta Z$ is a deviation amount of the periphery of the chip with respect to the chip center along the direction of the optical axis, the displacement amount at the two ends of the chip is almost doubled, and the main control system performs the following comparison.

$$2 \cdot \Delta Za \leq d \quad (5)$$

$$2 \cdot \Delta Zb \leq d \quad (6)$$

$$2 \cdot \Delta Zc \leq d \quad (7)$$

$$2 \cdot \Delta Zd \leq d \quad (8)$$

When all inequalities (5) to (8) are satisfied, any point of the surface of the chip pattern C20 falls within the range of the focal depth, as shown in FIG. 9A, and the surface is determined to be flat. When all inequalities (5) to (8) are not satisfied, all the points at the periphery of the surface of the chip pattern C20 are determined to be out of the range of the focal depth. If the surface is determined to be flat, the flow jumps to step 207. As described above, the gradient θ is directly measured, or the height position of the Z stage 41 upon focusing between the to-be-exposed chip pattern and the adjacent chip patterns is obtained, thereby determining whether the surface WS is flat.
(Step 207)

If the to-be-exposed area is flat, an optimal resolution can be obtained. For this reason, the main control system 46 outputs a command to the shutter control portion (not shown) of the illumination optical system to execute exposure (print) in that area.
(Step 208)

When the print operation is completed, the main control system 46 determines whether exposure for all the chips (shots) on one wafer is completed. If NO in step 208, the flow returns to step 202 to repeat the operation.
(Step 209)

If YES in step 208, the main control system 46 unloads (removes) the exposed wafer W.
(Step 210)

Since the X- and Y-coordinates of a portion of the exposed wafer, where the flatness is poor, have already been obtained, the main control system 46 operates the cleaning apparatus to clean the wafer holder 3 corresponding to the portion having the poor flatness.

An operation of the cleaning apparatus will be described with reference to FIG. 3. The Z stage 41 is shown as the wafer stage 5 in FIG. 3.

The X stage 42 and the Y stage 43 in FIG. 6 are driven to move the Z stage 41. After the wafer holder 3 is moved to the cleaning position, the Z stage 41 is stopped. An arm 22 is rotated in a φ direction by a rotating/driving portion 21, and a vertical driving shaft 24 having a cleaning tool 26 mounted thereon is conveyed and fixed to the upper portion of the cleaning position near an alignment microscope 19.

In general, the alignment microscope 19 is arranged at a position where the entire surface of a wafer on the wafer holder 3 can be observed. Therefore, by arranging the cleaning tool 26 near the alignment microscope 19, the cleaning tool 26 can reliably clean the entire wafer holder 3. The vertical driving shaft 24 is lowered toward the Z stage 41, and the cleaning tool 26 is brought into contact with the wafer holder 3 at a predetermined pressure.

The value of a variable m is initialized to 0. In a state wherein the cleaning tool 26 is in contact with the surface of the wafer holder 3 at a predetermined pressure, the Z stage 41 is slightly vibrated in the X and Y directions. With this operation, the cleaning tool 26 comes into slidable contact with the surface of the wafer holder 3 to clean the wafer holder 3 at a portion to which the dust or the like sticks. In this case, every time the wafer holder 3 and the cleaning tool 26 are relatively moved once, e.g., in the X direction, 1 is added to the value of the variable m. When the value of the variable m has reached a predetermined integer M, i.e., cleaning has been performed M times, the cleaning tool 26 is separated from the wafer holder 3. The arm 22 is then rotated in a direction opposite to the φ direction by the rotating/driving portion 21 so as to move the cleaning tool 26 to a position where the cleaning tool 26 does not interfere with a wafer sending operation, an exposure operation, and the like. Thereafter, the next wafer is loaded and exposed.

If it is determined that the dust or the like is widely distributed on the wafer holder 3, the entire surface of the wafer holder 3 may be cleaned by the cleaning tool 26. In this case, after the cleaning tool 26 is brought into contact with the wafer holder 3, the Z stage 41 starts uniform movement along a route 27 indicated by arrows. After the entire surface of the wafer holder 3 is scanned by the cleaning tool 26, it is checked whether the entire surface of the wafer holder 3 has been cleaned M times. If the number of cleaning operations does not reach the value M, the entire surface of the wafer holder 3 is cleaned by the cleaning tool 26 again. When the surface of the wafer holder 3 is to be repeatedly cleaned, the cleaning tool 26 scans the surface along the immediately preceding scanning route in the opposite direction, thus shortening the cleaning time.
(Step 211)

The main control system 46 determines whether all the wafers in the lot have been exposed. If some wafers are left unexposed, the operation is repeated from step 201.

If NO in step 206, the main control system 46 executes steps 220 to 232 to Generate various alarms on the basis of the parameters related to the alarms and set in step 200.
(Step 220)

The main control system 46 Generates a first alarm ALM-1 to alarm that the to-be-exposed chip pattern (e.g., chip pattern C20) on the wafer W has a flatness failure. The main control system 46 outputs information related to the position of the chip on the wafer as display data and stores the information. With this operation, the position of the chip pattern which causes a resolution failure is displayed on the display 46a.

(Step 221)

The main control system 46 increments a register (or a memory) for storing the Generation count of the alarm ALM-1 by one (+1 count). The register (or the memory) is cleared to 0 in step 201 when a new wafer is loaded.

(Step 222)

The main control system 46 determines, on the basis of the parameters set in step 200, whether the apparatus is stopped to end the exposure operation. If the apparatus is stopped, the operator must be notified of it, as a matter of course. This determination is referred to as "determination on an operator call" hereinafter.

(Step 223)

If YES in step 222, the main control system 46 stops the operation of the apparatus to set a wait state, and at the same time, outputs the signal ALM corresponding to the alarm ALM-1 to the alarm unit 46b. With this operation, the alarm unit 46b is set in a state representing that the to-be-exposed chip pattern on the wafer causes a resolution failure.

(Step 224)

In NO in step 222, the main control system 46 determines whether the generation count of the alarm ALM-1 counted in step 221, i.e., the number of chip patterns (shots) which should have caused a resolution failure, has reached a predetermined arbitrary number n. It may be determined whether the ratio of the number of shots exposed on one wafer to the number of shots for which the alarm ALM-1 has been generated has reached a predetermined value.

(Step 225)

The main control system 46 generates a second alarm ALM-2 to alarm that a predetermined number or more of chip patterns have caused flatness failures on one wafer. The main control system 46 outputs, as display data, information representing that resolution failures have occurred at a plurality of chip positions on the wafer. In other words, the information represents that the wafer is insufficiently flattened because of the suction failure of the wafer to the holder. With this operation, the display 46b displays that a flatness failure occurs because the number of foreign substances on the wafer holder 3 is too large, or the wafer W is largely warped.

(Step 226)

The main control system 46 determines, on the basis of the parameters set in advance, whether an operator call is necessary upon generation of the alarm ALM-2.

(Step 227)

If YES in step 226, the main control system 46 stops the operation of the apparatus to set a wait state, and at the same time, outputs the signal ALM corresponding to the alarm ALM-2 to the alarm unit 46b. With this operation, the alarm unit 46b notifies the operator of a high probability of suction failure by a display which can be distinguished from the display by the alarm ALM-1.

(Step 228)

If NO in step 226, the main control system 46 makes a comparison and determines whether the chip position where the alarm ALM-1 has been generated in step 220 is the same position or near the position where the flatness failure has occurred on one or a plurality of previously exposed wafers.

(Step 229)

As a result of the comparison in step 228, if the alarm ALM-1 has been generated at the same position or near the position on the previous wafer, the flow advances to step 230. If NO in step 229, the main control system 46 executes the operation from "print" in the above-described step 207.

(Step 230)

The main control system 46 generates a third alarm ALM-3 to alarm that resolution failures have occurred at the same position on a plurality of wafers, i.e., dust such as a fine resist powder probably sticks to a specific position on the wafer holder. With this operation, the display 46a displays that foreign substances stick to the wafer holder 3.

(Step 231)

The main control system 46 determines, on the basis of the parameters set in advance, whether an operator call is necessary upon generation of the alarm ALM-3. If NO in step 231, the operation from "print" in the above-described step 207 is executed.

(Step 232)

If YES in step 231, the main control system 46 stops the operation of the apparatus to set a wait state, and at the same time, outputs the signal ALM corresponding to the alarm ALM-3 to the alarm unit 46b. With this operation, the alarm unit 46b notifies the operator of the necessity of cleaning of the wafer holder or the like by a display which can be distinguished from the displays by the two previous alarms ALM-1 and ALM-2. On the basis of this alarm, when the operator designates the main control system 46 to perform a cleaning operation, the wafer holder 3 is cleaned at the position where the foreign substances stick, as in step 210.

As described above, according to this embodiment, an area on the wafer holder 3 where foreign substances stick is exclusively cleaned. For this reason, the cleaning time is shortened, and the throughput of the exposure process is improved.

Figure 11:
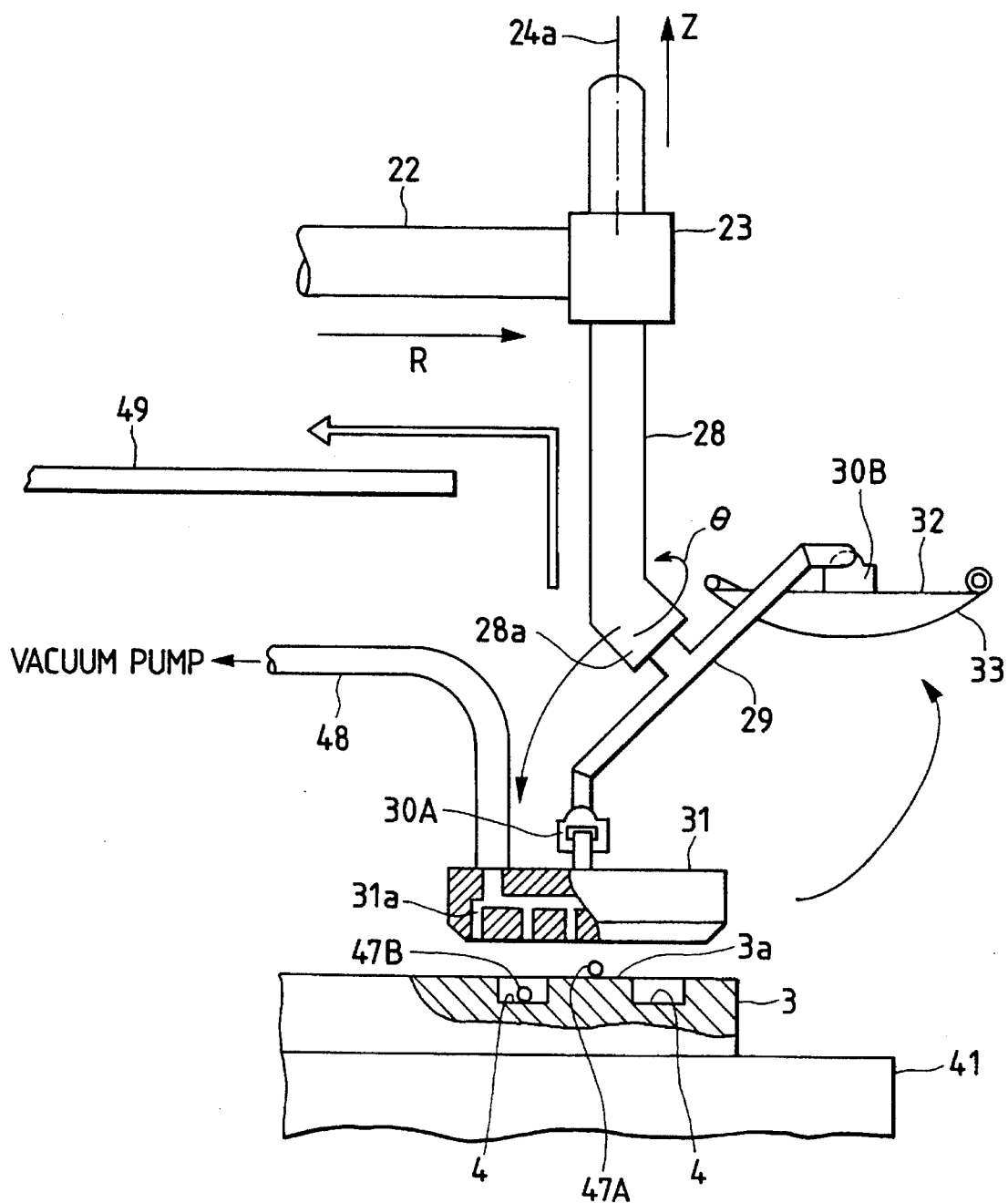
FIG. 11 is a side view showing the main part of a modification of a cleaning tool.

A modification of the cleaning tool will be described below with reference to FIG. 11. FIG. 11 shows a state when the wafer holder 3 is cleaned. Referring to FIG. 11, in which the same reference numerals denote the same parts as in FIG. 6, a vertical driving shaft 28 is fitted in a vertical driving portion 23 connected to the other end of the arm 22. A lower end portion 28a of the vertical driving shaft 28 is bent into an "L" shape. A rotating arm 29 is mounted on the distal end of the lower end portion 28a. The rotating arm 29 can be rotated about the axis of the lower end portion 28a in a θ direction by a driving unit in the lower end portion 28a. A thin rectangular parallelepiped whetstone 31 is attached to one end of the rotating arm 29 through a connecting portion 30A. A take-up portion 32 is attached to the other end of the rotating arm 29 through a connecting portion 30B. A dust-free cloth 33 is wound around the take-up portion 32. Air holes 31a are formed in the whetstone 31. The air holes 31a are connected to an external vacuum pump (not shown) through a tube 48.

When the wafer holder 3 is to be cleaned, the rotating arm 22 is moved or rotated in an R direction parallel to the surface of the wafer holder 3, and the rotating arm 29 is rotated in the θ direction to move the whetstone 31 or the dust-free cloth 33 onto the wafer holder 3. Thereafter, the vertical driving shaft 28 is lowered toward the wafer holder 3 along an axis 24a parallel to a Z axis, thereby bringing the whetstone 31 or the dust-free cloth 33 into contact with the wafer holder 3. In this case, since the whetstone 31 and the dust-free cloth 33 respectively having predetermined weights are attached to the rotating arm 29 to be freely movable, the whetstone 31 and the dust-free cloth 33 are biased against the surface of the wafer holder 3 at predetermined pressures corresponding to their weights. By moving the wafer holder 3 in this state, the wafer holder 3 is cleaned.

The whetstone 31 is generally effective with respect to foreign substances such as dust sticking to the wafer holder 3. The whetstone 31 is used once for several cleaning operations. To the contrary, the dust-free cloth 33 is used to wipe dust and the like off from the wafer holder 3, as needed.

In addition, since the dust-free cloth 33 can fit the three-dimensional patterns of the surface of the wafer holder 3, not only dust 47A on a surface (convex portion) 3a of the wafer holder 3 but also dust 47B scraped from the convex portion of the wafer holder 3 and dropped in the grooves 4 can be removed by the dust-free cloth 33. In this case, the Z stage 41 is driven along a locus corresponding to the shape of the grooves 4 of the wafer holder 3. In this embodiment, the grooves 4 are concentric. For example, when all the grooves 4 of the wafer holder 3 are to be cleaned, the dust-free cloth 33 is temporarily moved upward upon completion of cleaning of one round. The dust-free cloth 33 is lowered again to clean the next round.

To more properly clean the grooves 4 of the wafer holder 3, the external vacuum pump can be operated in a state wherein the whetstone 31 is in contact with the surface 3a of the wafer holder 3, thereby cleaning the dust 47B on the grooves 4 through the air holes 31a. By using the whetstone 31 and the dust-free cloth 33 alternately in this manner, both the convex and concave portions of the wafer holder 3 can be properly cleaned.

As described above, by cleaning the concave portions of the wafer holder 3, dust or the like accumulated in the concave portions is not scattered toward the convex portions of the wafer holder 3 by an air flow in a stage stop state, unlike the prior art. For this reason, the flatness of the wafer can be more properly ensured.

A contact position between the wafer holder 3 and the dust-free cloth 33 can be automatically changed by using a structure in which the dust-free cloth 33 is wound around the take-up portion 32 in a rolled fashion. Alternatively, foreign substances sticking to the whetstone 31 and the dust-free cloth 33 can be removed by applying vibration to the vertical driving shaft 28. With such a mechanism added to the apparatus, there is no need for performing maintenance of cleaning mechanism for a long period of time. The above embodiment uses a structure in which the whetstone 31 and the dust-free cloth 33 are separately brought into contact with the surface of the wafer holder 3. However, if the whetstone 31 and the dust-free cloth 33 are concurrently brought into contact with the surface of the wafer holder 3 to clean the surface of the wafer holder 3 by both the whetstone 31 and the dust-free cloth 33 at the same time, the wafer holder 3 can be quickly cleaned with a simpler arrangement.

In the embodiment shown in FIG. 11, a biasing force acting on the wafer holder 3 is set by the weight of the whetstone 31 or the dust-free cloth 33 as a cleaning tool. However, an actual biasing force acting on the wafer holder 3 may be monitored by a pressure sensor, and the wafer holder 3 may be cleaned while a predetermined pressure is applied. In addition, if the contact area of the cleaning member is set to be a value allowing the cleaning member to come into contact with two different convex portions of the convex and concave portions of the wafer holder 3, the cleaning member is not caught by an edge portion of the wafer holder 3 during a cleaning operation.

In FIG. 11, a plate-like foreign substance drop prevention member 49 kept in almost a horizontal state is arranged near the arm 22. In this case, after the cleaning operation for the wafer holder 3 is completed, the whetstone 31 and the dust-free cloth 33 as the cleaning tool are retreated onto the foreign substance drop prevention member 49 along a route indicated by an arrow. Therefore, the foreign substances sticking to the whetstone 31 or the dust-free cloth 33 do not drop on the wafer holder 3 again. With this arrangement, the retreat time of the cleaning tool can be shortened.

Another example of the cleaning operation for the wafer holder 3 in the exposure apparatus in FIG. 6 will be described below with reference to FIG. 12.

Figure 12:
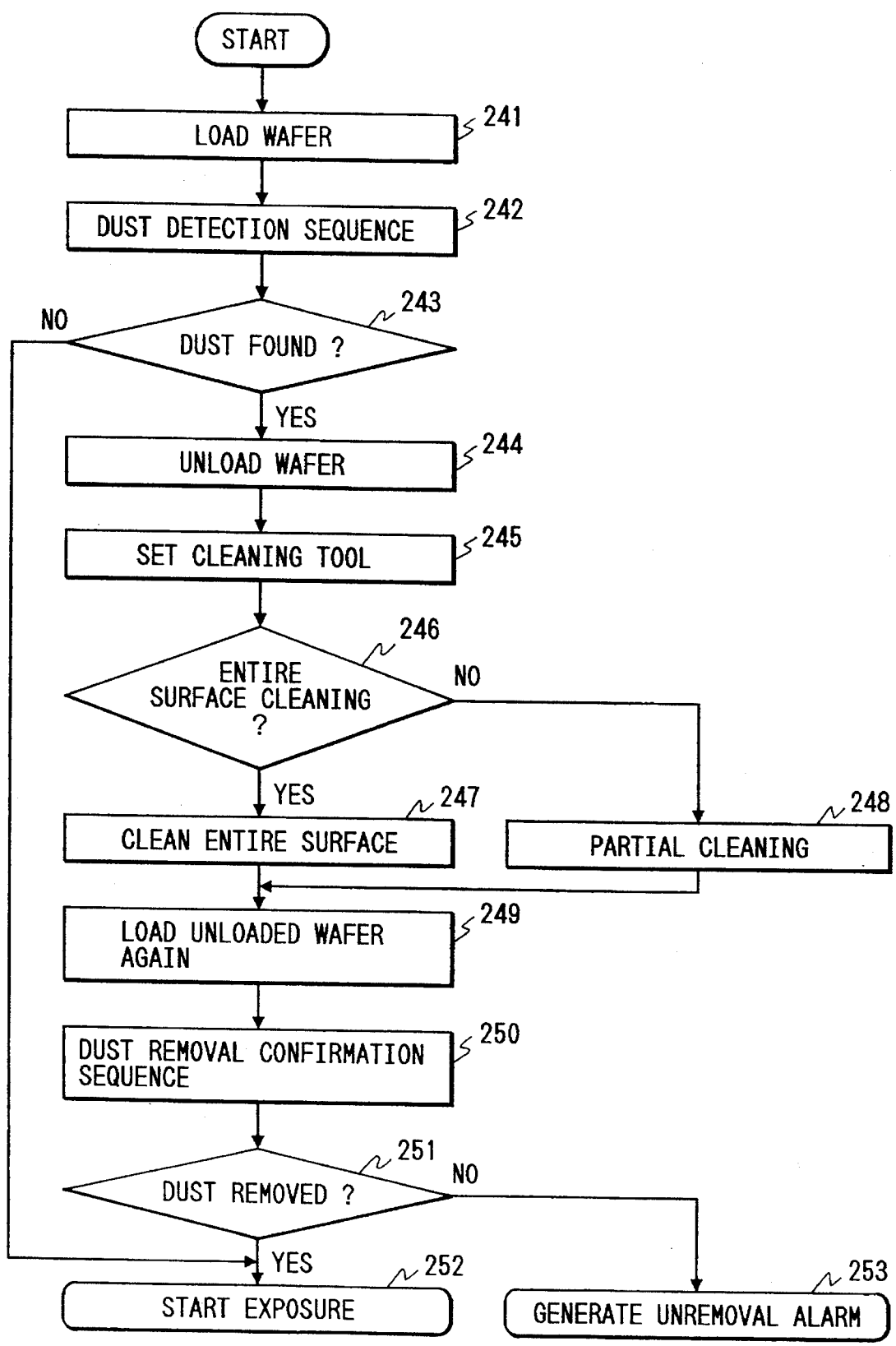
FIG. 12 is a flow chart showing another cleaning operation for the wafer holder 3 of the third embodiment.

In step 241 in FIG. 12, the wafer W is loaded onto the wafer holder 3 in FIG. 6. In step 242, using the focus detection system (the illumination optical system 44 and the condensing optical system 45), the three-dimensional state of the exposure surface of the wafer W is measured, thereby detecting foreign substances (to be referred to as dust hereinafter) between the wafer holder 3 and the wafer W. If no dust is detected, the flow advances from step 243 to step 252 to expose the wafer W.

If dust is detected in step 243, the wafer W is removed (unloaded) from the wafer holder 3 in step 244. Thereafter, in step 245, the cleaning tool 26 is set at a predetermined position. In step 246, it is determined whether the entire surface of the wafer holder 3 is to be cleaned. If YES in step 246, the entire surface of the wafer holder 3 is cleaned in step 247. If NO in step 246, only a portion on the wafer holder 3 where the dust is present is exclusively cleaned in step 248.

In step 249, the wafer W removed from the wafer holder 3 is loaded onto the wafer holder 3 again. In step 250, using the focus detection system (the illumination optical system 44 and condensing optical system 45) again, the three-dimensional state of the exposure surface of the wafer W is measured, thereby detecting foreign substances (to be referred to as dust hereinafter) between the wafer holder 3 and the wafer W. This sequence is performed to confirm that the dust on the wafer holder 3 has been removed. In step 251, if it is determined that the dust has been removed, the flow advances to step 252 to expose the wafer W. If it is determined in step 251 that the dust has not been removed yet, the flow advances to step 253, and the main control system 46 generates an "unremoval alarm" representing that the dust could not be removed to the display 46a or the like. In this case, the operator e.g., manually cleans the wafer holder 3. With this operation, dust which cannot be removed by the cleaning tool 26 in FIG. 6 can be properly removed.

In the above embodiment, the whetstone and the dust-free cloth are used as cleaning tools. However, a solvent for dissolving the dust or the like can be added to the dust-free cloth. In this state, the cleaning operation can be more effectively performed. For example, dust such as a resist powder can be dissolved with acetone or the like and wiped off. In addition, as a method of measuring the focus position and the gradient of the exposure surface of a wafer, a structure in which a plurality of focus detection systems in FIG. 6 are arranged can also be used. Alternatively, a plurality of focus measuring means such as a plurality of focus detection systems disclosed in the above-described U.S. Pat. No. 4,383,757 can be used to parallelly check the abnormality of the focus position and the gradient of the exposure surface of the wafer. With this structure, generation of foreign substances can be checked at a higher speed.

For example, in the above-described step 204, to check the flatness of the surface WS by directly obtaining the gradient θ, a method in which a plurality of focus detection systems disclosed in U.S. Pat. No. 4,383,757 are used in place of the focus detection system 45 to measure the gradient θ may also be used. More specifically, the plurality of focus detection systems radiate a plurality of light beams in one shot area of the wafer W, receive light reflected from a plurality of portions on the wafer W, and output signals according to the height positions (or deviation amounts from the focusing plane of the projection optical system 1) of the surface of the wafer W for the plurality of portions (measurement of Pθ). The main control system 46 calculates the gradient θ with respect to the focusing plane FP of the wafer surface WS on the basis of the Pθ output for each of the plurality of portions (step 205). In place of the focus detection system, as disclosed in U.S. Pat. No. 4,558,949, a leveling detection system for detecting a tilt angle in each shot area of the wafer on the basis of the area of the divided detector on which the light reflected from the wafer surface is incident may be used to directly obtain the gradient θ.

In the above-described step 204, the flatness is calculated by an arithmetic operation from the correlation of the height positions of the stage upon focusing between a to-be-exposed chip pattern and the adjacent chip patterns. Instead, the flatness may be calculated by the same arithmetic operation from the correlation of height positions between a plurality of points at the peripheral portion in the exposure area of a to-be-exposed chip pattern and a shot center. In this case, a plurality of focus detection systems disclosed in Japanese Laid-Open Patent Application No. 55-134812 may be used in place of the focus detection system to detect the height positions of the plurality of points at the peripheral portion in the exposure area of the to-be-exposed chip pattern and the shot center.

Without performing an operator call and an exposure operation for a shot area having a poor flatness, an exposure operation may be performed to the last shot area of one wafer, and the position of the unexposed shot area may be set as a cleaning necessary area. The flatness of the wafer holder 3 may be directly detected by the focus detection system. A portion on the wafer holder 3 having a poor flatness can be considered as a portion where foreign substances stick.

As described above, the present invention is not limited to the above embodiments, and various arrangement can be made within the spirit and scope of the invention.

According to this embodiment, when foreign substances on a substrate holding member is automatically cleaned, the presence/absence and the position of the foreign substances can be automatically determined. For this reason, by exclusively cleaning the position where the foreign substances stick, a cleaning operation can be performed at a high speed. By simultaneously cleaning the concave portions of the substrate holding member, the foreign substance are prevented from moving from the concave portions to the convex portions. Therefore, Generation of secondary foreign substances can be prevented.

In addition, if it is checked whether foreign substances are present on the substrate holding member again after the substrate holding member is cleaned, the unremoved foreign substances can be properly removed.

Furthermore, with a foreign substance drop prevention member, the cleaning means can be retreated in a short period of time, thereby further improving the throughput of the exposure process.

What is claimed is:

1. An exposure apparatus including a stage which has a holding member and which moves within a stage movable range on a two-dimensional plane, said holding member having a surface on which a photosensitive substrate is held by a chucking mechanism, and said apparatus being adapted to expose a pattern of a mask onto the photosensitive substrate and comprising:

(a) cleaning means for performing a cleaning operation with respect to the surface of said holding member; and (b) biasing means for biasing said cleaning means to bring said cleaning means into contact with the surface of said holding member in the cleaning operation, wherein (c) said stage moves within the stage movable range on the two-dimensional plane to cause said cleaning means to execute the cleaning operation while said cleaning means is biased against the surface.

2. An apparatus according to claim 1, wherein a relative positional relationship between said cleaning means and said stage is set such that said cleaning means can clean the entire surface of said holding member when said stage moves within the stage movable range.

3. An apparatus according to claim 1, wherein said cleaning means includes an abrasive member capable of scraping foreign substances off the surface of said holding member.

4. An apparatus according to claim 1, wherein said cleaning means includes a non-abrasive member capable of wiping foreign substances off the surface of said holding member.

5. A apparatus according to claim 1, wherein said cleaning means includes an abrasive member capable of scraping foreign substances off the surface of said holding member and a non-abrasive member capable of wiping foreign substances off the surface of said holding member.

6. An apparatus according to claim 1, wherein an area, of said cleaning means, which is brought into contact with said holding member is smaller than an area of the surface of said holding member.

7. An apparatus according to claim 1, wherein said biasing means includes (a) a biasing force adjusting member for adjusting a biasing force which brings said cleaning means into contact with said holding member, and (b) a biasing force sensor member for sensing the biasing force.

8. An apparatus according to claim 1, further comprising (a) counting means for counting a number of photosensitive substrates exposed by said exposure apparatus, and (b) means for causing said cleaning means to perform the cleaning operation when a count value obtained by said counting means has reached a predetermined value.

9. An apparatus according to claim 1, further comprising moving means for moving said cleaning means along a plane parallel to a two-dimensional plane of said stage between a cleaning position and a cleaning stop position, and wherein said cleaning means is located above the surface of said holding member when set at the cleaning position, and is spaced apart laterally from the surface of said holding member when set at the cleaning stop position.

10. An apparatus according to claim 9, further comprising removing means for removing foreign substances adhered to said cleaning means at the cleaning stop position.

11. An apparatus according to claim 10, wherein said removing means includes a vibrating member for vibrating said cleaning means.

12. An exposure apparatus including a stage which has a holding member and which moves within a stage movable range on a two-dimensional plane, said holding member having a surface on which a photosensitive substrate is held by a chucking mechanism, said apparatus being adapted to expose a pattern of a mask onto the photosensitive substrate and comprising:

(a) cleaning means for performing a cleaning operation with respect to the surface of said holding member;

(b) biasing means for biasing said cleaning means to bring said cleaning means into contact with the surface of said holding member in the cleaning operation; and (c) means for moving said cleaning means along a plane parallel to a two-dimensional plane of said stage between a cleaning position and a cleaning stop position, said cleaning means being located above the surface of said holding member when set at the cleaning position, and being spaced apart laterally from the surface of said holding member when set at the cleaning stop position.

13. An apparatus according to claim 12, wherein said cleaning means includes means for sucking foreign substances from said surface.

14. An apparatus according to claim 12, further comprising removing means for removing foreign substances adhered to said cleaning means at the cleaning stop position.

15. An apparatus according to claim 12, wherein said cleaning means includes an abrasive member capable of scraping foreign substances off the surface of said holding member and a non-abrasive member capable of wiping foreign substances off the surface of said holding member, and the surface of said holding member is cleaned by said abrasive member and said non-abrasive member.

16. An exposure apparatus including a stage which has a holding member and which moves within a stage movable range on a two-dimensional plane, said holding member having a surface on which a photosensitive substrate is held by a chucking mechanism, said apparatus being adapted to expose a pattern of a mask onto the photosensitive substrate and comprising:
  (a) a cleaner for cleaning the surface of said holding member; and
  (b) a driving portion disposed so as to be able to bring said cleaner into contact with the surface of said holding member in the cleaning operation;
  wherein (c) said stage moves within the stage movable range on the two-dimensional plane to cause said cleaner to execute the cleaning operation while said cleaner is biased against the surface of said holding member.

17. An exposure apparatus including a stage which has a holding member and which moves within a stage movable range on a two-dimensional plane, said holding member having a surface on which a photosensitive substrate is held by a chucking mechanism, said apparatus being adapted to expose a pattern of a mask onto the photosensitive substrate and comprising:
  (a) a cleaner for cleaning the surface of said holding member;
  (b) a first driving portion disposed so as to be able to bring said cleaner into contact with the surface of said holding member in the cleaning operation; and
  (c) a second driving portion connected to said first driving portion to move said cleaner along a plane parallel to a two-dimensional plane of said stage between a cleaning position and a cleaning stop position, said cleaner being located above the surface of said holding member when set at the cleaning position and being spaced apart laterally from the surface of said holding member when set at the cleaning stop position.

18. An apparatus according to claim 17, further comprising removing means for removing foreign substances adhered to said cleaner at the cleaning stop position.

19. An apparatus according to claim 17, wherein said cleaner includes an abrasive member capable of scraping foreign substances off the surface of said holding member and a non-abrasive member capable of wiping foreign substances off the surface of said holding member, and the surface of said holding member is cleaned by said abrasive member and said non-abrasive member.

20. A cleaning apparatus comprising:
  (a) a holding member on which a substrate is held by a chucking mechanism;
  (b) cleaning means for performing a cleaning operation with respect to a surface of said holding member; and
  (c) biasing means for biasing said cleaning means to bring said cleaning means into contact with the surface of said holding member in the cleaning operation;
  wherein (d) said cleaning means includes an abrasive member capable of scraping foreign substances off the surface of said holding member and a non-abrasive member capable of wiping foreign substances off the surface of said holding member,
  (e) the surface of said holding member is cleaned by said abrasive member and said non-abrasive member, and
  (f) said cleaning means includes means for sucking foreign substances from the surface of said holding member.

21. A cleaning apparatus comprising:
  (a) a holding member on which a substrate is held by a chucking mechanism;
  (b) a cleaner for cleaning a surface of said holding member; and
  (c) a driving portion disposed so as to be able to bring said cleaner into contact with the surface of said holding member in the cleaning operation;
  wherein (d) said cleaner includes an abrasive member capable of scraping foreign substances off the surface of said holding member and a non-abrasive member capable of wiping foreign substances off the surface of said holding member,
  (e) the surface of said holding member is cleaned by said abrasive member and said non-abrasive member, and
  (f) said cleaning means includes means for sucking foreign substances from the surface of said holding member.

22. An exposure apparatus including a stage which has a holding member and which moves within a stage movable range on a two-dimensional plane, said holding member having a surface on which a photosensitive substrate is held by a chucking mechanism, said apparatus being adapted to expose a pattern of a mask onto the photosensitive substrate and comprising:
  (a) cleaning means for performing a cleaning operation with respect to the surface of said holding member;
  (b) a sensor for detecting a height position of said photosensitive substrate held on said holding member;
  (c) an operating portion for determining an area on said surface to be an area which needs to be cleaned, based on a measurement result from said sensor; and
  (d) a driving portion for driving said cleaning means to clean the area on said surface.

23. An apparatus according to claim 22, wherein said sensor detects a height position of an exposure area of said photosensitive substrate or a portion of said photosensitive substrate near said exposure area.

24. An apparatus according to claim 22, further comprising a projection optical system for projecting said pattern on said photosensitive substrate, and wherein
  said operating portion determines an area where a flatness of said photosensitive substrate is outside an allowable range to be an area which needs to be cleaned, the allowable range being determined in accordance with a focal depth of said projection optical system.

25. An apparatus according to claim 24, wherein a cleaning area determined by said operating portion is at or near an area on said surface which is located under the area where the flatness of said photosensitive substrate is outside the allowable range.

26. An apparatus according to claim 22, further comprising a plate for receiving foreign substances from said cleaning means, and wherein said cleaning means is located on said plate during an exposure operation with respect to said photosensitive substrate.

27. An apparatus according to claim 22, further comprising bias means for biasing said cleaning means to bring said cleaning means into contact with the surface of said holding member in the cleaning operation.

28. An exposure apparatus including a stage which has a holding member and which moves within a stage movable range on a two-dimensional plane, said holding member having a surface on which a photosensitive substrate is held by a chucking mechanism, said apparatus being adapted to expose a pattern of a mask onto the photosensitive substrate and comprising:
(a) a cleaner for cleaning the surface of said holding member;
(b) a sensor for detecting a height position of said photosensitive substrate held on said holding member;
(c) an operating portion for determining an area on said surface to be an area which needs to be cleaned, based on a measurement result from said sensor; and
(d) a driving portion for driving said cleaner to clean said area on said surface.

29. An exposure apparatus including a stage which has a holding member and which moves within a stage movable range on a two-dimensional plane, said holding member having a surface on which a photosensitive substrate is held by a chucking mechanism, said apparatus being adapted to expose a pattern of a mask onto the photosensitive substrate and comprising:
(a) a cleaner for cleaning the surface of said holding member;
(b) a sensor for detecting a height position of said surface;
(c) an operating portion for determining an area on said surface to be an area which needs to be cleaned, based on a measurement result from said sensor; and
(d) a driving portion for driving said cleaner to clean said area on said surface.

30. A cleaning apparatus comprising:
(a) a holding member on which a substrate is held by a chucking mechanism;
(b) cleaning means for performing a cleaning operation with respect to a surface of said holding member;
(c) a sensor for detecting a height position of said surface;
(d) an operating portion for determining an area on said surface to be an area which needs to be cleaned, based on a measurement result from said sensor; and
(e) a driving portion for driving said cleaner to clean said area on said surface.

31. An exposure method comprising the steps of:
(a) exposing a pattern of a mask onto a photosensitive substrate held on a holding member;
(b) cleaning a surface of said holding member;
(c) counting a number of photosensitive substrate exposed by said exposure apparatus; and
(d) performing said cleaning step when a count value has reached a predetermined value.

32. An exposure method for exposing a pattern of a mask onto a photosensitive substrate in an exposure apparatus including a stage which has a holding member and which moves within a stage movable range on a two-dimensional plane, said holding member having a surface on which said photosensitive substrate is held by a chucking mechanism, said method comprising the steps of:
(a) cleaning the surface of said holding member;
(b) detecting, with a sensor, a height position of said photosensitive substrate held on said holding member;
(c) determining an area on said surface to be an area which needs to be cleaned, based on a measurement result from the sensor; and
(d) cleaning said area on said surface.

33. A method according to claim 32, further comprising the steps of:
detecting a height position of said photosensitive substrate held on said holding member, after the cleaning step; and
determining whether said surface needs to be cleaned again.

34. An exposure method for exposing a pattern of a mask onto a photosensitive substrate in an exposure apparatus including a stage which has a holding member and which moves within a stage movable range on a two-dimensional plane, said holding member having a surface on which said photosensitive substrate is held by a chucking mechanism, said method comprising the steps of:
(a) cleaning the surface of said holding member;
(b) detecting, with a sensor, a height position of said surface;
(c) determining an area on said surface to be an area which needs to be cleaned, based on a measurement result from the sensor; and
(d) cleaning said area on said surface.

* * * * *